US012805110B2

(12) United States Patent
Saito

(10) Patent No.: US 12,805,110 B2
(45) Date of Patent: Nov. 17, 2026

(54) DETECTION DEVICE

(71) Applicant: Japan Display Inc., Tokyo (JP)

(72) Inventor: Keiichi Saito, Tokyo (JP)

(73) Assignee: Japan Display Inc., Tokyo (JP)

( * ) Notice: Subject to any disclaimer, the term of this patent is extended or adjusted under 35 U.S.C. 154(b) by 329 days.

(21) Appl. No.: 18/544,861

(22) Filed: Dec. 19, 2023

(65) Prior Publication Data

US 2024/0206201 A1 Jun. 20, 2024

(30) Foreign Application Priority Data

Dec. 20, 2022 (JP) ................................. 2022-203690

(51) Int. Cl.
*G06V 10/141* (2022.01)
*H10K 39/32* (2023.01)
*G06V 40/13* (2022.01)

(52) U.S. Cl.
CPC ........... *H10K 39/32* (2023.02); *G06V 10/141* (2022.01); *G06V 40/1318* (2022.01)

(58) Field of Classification Search
CPC ... H10K 39/32; G06V 10/141; G06V 40/1318
See application file for complete search history.

(56) References Cited

U.S. PATENT DOCUMENTS

| | | | | |
|---|---|---|---|---|
| 11,109,471 | B1 * | 8/2021 | Recker | H02J 9/02 |
| 2005/0078492 | A1 * | 4/2005 | Takahashi | H02M 3/33523 363/21.15 |
| 2018/0012069 | A1 | 1/2018 | Chung et al. | |
| 2023/0379599 | A1 | 11/2023 | Saito et al. | |

FOREIGN PATENT DOCUMENTS

| | | | | | |
|---|---|---|---|---|---|
| CN | 111129051 | B * | 11/2022 | H10F 39/014 |
| JP | 2022-121297 | A | 8/2022 | |
| WO | WO-2018106513 | A1 * | 6/2018 | B81B 7/008 |
| WO | WO-2020105418 | A1 * | 5/2020 | G06V 40/1318 |

OTHER PUBLICATIONS

Office Action mailed on May 19, 2026 in corresponding Japanese Patent Application No. 2022-203690 and English translation of same. 9 pages.

* cited by examiner

*Primary Examiner* — Mohammad M Choudhry
(74) *Attorney, Agent, or Firm* — K&L Gates LLP

(57) ABSTRACT

According to an aspect, a detection device includes: a plurality of organic photodiodes arranged in a detection area; a plurality of capacitive elements each coupled in parallel to a corresponding organic photodiode of the organic photodiodes; an analog front-end (AFE) circuit configured to read an electric charge amount stored in each of the capacitive elements to acquire a detection value of each of the organic photodiodes; a power supply circuit configured to supply a power supply potential to collectively apply a reverse bias to the organic photodiodes; and a control circuit configured to control the power supply potential. The organic photodiodes each includes: an active layer; an upper electrode provided with an upper buffer layer interposed between the upper electrode and the active layer; and a lower electrode provided with a lower buffer layer interposed between the lower electrode and the active layer.

18 Claims, 32 Drawing Sheets

FIG.14
122
123
CONTROL CIRCUIT
VDDSNSCTRL
POWER SUPPLY CIRCUIT

FIG.18

| | 1 | 2 | 3 | ··· | N-1 | N |
|---|---|---|---|---|---|---|
| 1 | AFESIG(1, 1) | AFESIG(2, 1) | AFESIG(3, 1) | | AFESIG(N-1, 1) | AFESIG(N, 1) |
| 2 | AFESIG(1, 2) | AFESIG(2, 2) | AFESIG(3, 2) | | AFESIG(N-1, 2) | AFESIG(N, 2) |
| 3 | AFESIG(1, 3) | AFESIG(2, 3) | AFESIG(3, 3) | | AFESIG(N-1, 3) | AFESIG(N, 3) |
| ⋮ | | | | | | |
| M-1 | AFESIG(1, M-1) | AFESIG(2, M-1) | AFESIG(3, M-1) | | AFESIG(N-1, M-1) | AFESIG(N, M-1) |
| M | AFESIG(1, M) | AFESIG(2, M) | AFESIG(3, M) | | AFESIG(N-1, M) | AFESIG(N, M) |

FIG.19

| RANK | AFE OUTPUT VALUE |
|---|---|
| 1 | AFESIG(1) |
| 2 | AFESIG(2) |
| 3 | AFESIG(3) |
| ⋮ | ⋮ |
| p | AFESIG(p) |
| ⋮ | ⋮ |
| q | AFESIG(q) |
| q+1 | AFESIG(q+1) |
| ⋮ | ⋮ |
| q+r | AFESIG(q+r) |
| ⋮ | ⋮ |
| P-2 | AFESIG(P-2) |
| P-1 | AFESIG(P-1) |
| P | AFESIG(P) |

A (ranks 1 to q+r)

AFESIGth (AFESIG(p) to AFESIG(q+1))

FIG.24

| RANK | AFE OUTPUT VALUE | |
|---|---|---|
| 1 | AFESIG(1) | |
| 2 | AFESIG(2) | |
| 3 | AFESIG(3) | |
| 4 | AFESIG(4) | |
| 5 | AFESIG(5) | UPPER |
| 6 | AFESIG(6) | |
| 7 | AFESIG(7) | |
| 8 | AFESIG(8) | |
| 9 | AFESIG(9) | |
| 10 | AFESIG(10) | |
| ⋮ | ⋮ | |
| p | AFESIG(p) | |
| ⋮ | ⋮ | |
| ⋮ | ⋮ | |
| ⋮ | ⋮ | |
| q | AFESIG(q) | |
| q+1 | AFESIG(q+1) | |
| ⋮ | ⋮ | AFESIGaveth |
| q+r | AFESIG(q+r) | |
| q+r+1 | AFESIG(q+r+1) | |
| ⋮ | ⋮ | |
| ⋮ | ⋮ | |
| ⋮ | ⋮ | |
| P-9 | AFESIG(P-9) | |
| P-8 | AFESIG(P-8) | |
| P-7 | AFESIG(P-7) | |
| P-6 | AFESIG(P-6) | |
| P-5 | AFESIG(P-5) | LOWER |
| P-4 | AFESIG(P-4) | |
| P-3 | AFESIG(P-3) | |
| P-2 | AFESIG(P-2) | |
| P-1 | AFESIG(P-1) | |
| P | AFESIG(P) | |

FIG.28

| RANK | AFE OUTPUT VALUE | |
|---|---|---|
| 1 | AFESIG(1) | UPPER |
| 2 | AFESIG(2) | UPPER |
| 3 | AFESIG(3) | UPPER |
| 4 | AFESIG(4) | UPPER |
| 5 | AFESIG(5) | UPPER |
| 6 | AFESIG(6) | UPPER |
| 7 | AFESIG(7) | UPPER |
| 8 | AFESIG(8) | UPPER |
| 9 | AFESIG(9) | UPPER |
| 10 | AFESIG(10) | UPPER |
| ⋮ | ⋮ | |
| p | AFESIG(p) | |
| ⋮ | ⋮ | |
| ⋮ | ⋮ | |
| ⋮ | ⋮ | |
| q | AFESIG(q) | AFESIGthC |
| q+1 | AFESIG(q+1) | AFESIGthC |
| ⋮ | ⋮ | AFESIGthC |
| q+r | AFESIG(q+r) | AFESIGthC |
| q+r+1 | AFESIG(q+r+1) | AFESIGthC |
| ⋮ | ⋮ | |
| ⋮ | ⋮ | |
| ⋮ | ⋮ | |
| P-9 | AFESIG(P-9) | LOWER |
| P-8 | AFESIG(P-8) | LOWER |
| P-7 | AFESIG(P-7) | LOWER |
| P-6 | AFESIG(P-6) | LOWER |
| P-5 | AFESIG(P-5) | LOWER |
| P-4 | AFESIG(P-4) | LOWER |
| P-3 | AFESIG(P-3) | LOWER |
| P-2 | AFESIG(P-2) | LOWER |
| P-1 | AFESIG(P-1) | LOWER |
| P | AFESIG(P) | LOWER |

DETECTION DEVICE

CROSS-REFERENCE TO RELATED APPLICATION

This application claims the benefit of priority from Japanese Patent Application No. 2022-203690 filed on Dec. 20, 2022, the entire contents of which are incorporated herein by reference.

BACKGROUND

1. Technical Field

What is disclosed herein relates to a detection device.

2. Description of the Related Art

In these years, optical biometric sensors are known as biometric sensors used for personal authentication, for example. Fingerprint sensors (refer to United States Patent Application Publication No. 2018/0012069 (US-A-2018/0012069), for example) and vein sensors are known as such biometric sensors. In a fingerprint sensor described in US-A-2018/0012069, a plurality of photoelectric conversion elements such as photodiodes are arranged on a semiconductor substrate. Each of the photoelectric conversion elements outputs a signal that changes depending on the amount of light emitted thereto.

Organic photo detectors, such as organic photodiodes (OPDs), are known as the photoelectric conversion elements for detection. In detection devices using the OPDs, defects in an organic semiconductor layer or a conductive layer generated by foreign matter or external scars can cause spot-like irregularities, which may cause degradation in detection accuracy and imaging characteristics.

For the foregoing reasons, there is a need for a detection device capable of improving the detection accuracy and the imaging characteristics.

SUMMARY

According to an aspect, a detection device includes: a plurality of organic photodiodes arranged in a detection area; a plurality of capacitive elements each coupled in parallel to a corresponding organic photodiode of the organic photodiodes; an analog front-end (AFE) circuit configured to read an electric charge amount stored in each of the capacitive elements to acquire a detection value of each of the organic photodiodes; a power supply circuit configured to supply a power supply potential to collectively apply a reverse bias to the organic photodiodes; and a control circuit configured to control the power supply potential. The organic photodiodes each includes: an active layer; an upper electrode provided with an upper buffer layer interposed between the upper electrode and the active layer; and a lower electrode provided with a lower buffer layer interposed between the lower electrode and the active layer.

BRIEF DESCRIPTION OF THE DRAWINGS

FIG. 18 is a table illustrating an example of AFE output value information;

FIG. 19 is a table illustrating an example of AFE output value descending order sort information that serves as a base of the calibration process for the sensor power supply potential according to the first embodiment;

FIG. 24 is a table illustrating an example of the AFE output value descending order sort information that serves as the base of the calibration process for the sensor power supply potential according to the second embodiment;

FIG. 28 is a table illustrating an example of the AFE output value descending order sort information that serves as the base of the calibration process for the sensor power supply potential according to the third embodiment;

DETAILED DESCRIPTION

Figure 1:
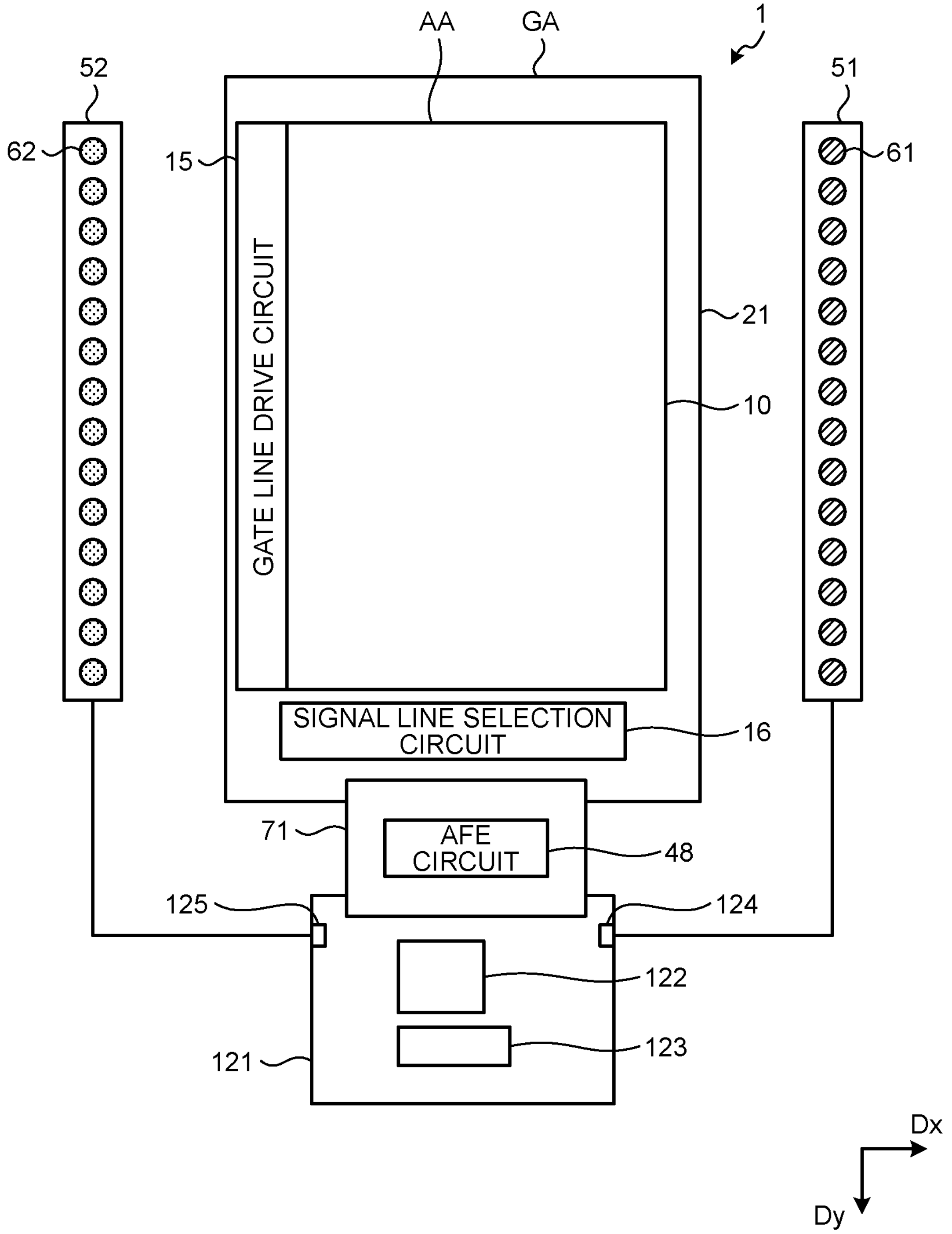
FIG. 1 is a plan view illustrating a detection device according to an embodiment of the present disclosure.

The following describes modes (embodiments) for carrying out the present disclosure in detail with reference to the drawings. The present disclosure is not limited to the description of the embodiments given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the disclosure. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference numeral through the description and the drawings, and detailed description thereof may not be repeated where appropriate.

In this disclosure, when an element is described as being “on” another element, the element can be directly on the other element, or there can be one or more elements between the element and the other element.

FIG. 1 is a plan view illustrating a detection device according to an embodiment of the present disclosure. As illustrated in FIG. 1, a detection device 1 includes a sensor base member 21, a sensor area 10, a gate line drive circuit 15, a signal line selection circuit 16, an analog front-end (AFE) circuit 48, a control circuit 122, a power supply circuit 123, and first and second light sources 61 and 62. FIG. 1 illustrates an example in which a first light source base member 51 is provided with a plurality of the first light sources 61 and a second light source base member 52 is provided with a plurality of the second light sources 62. However, the arrangement of the first and the second light sources 61 and 62 illustrated in FIG. 1 is merely an example and can be changed as appropriate. For example, the first and the second light sources 61 and 62 may be arranged on each of the first and the second light source base members 51 and 52. In this case, a group including the first light sources 61 and a group including the second light sources 62 may be arranged in a second direction Dy, or the first and the second light sources 61 and 62 may be alternately arranged in the second direction Dy. The first and the second light sources 61 and 62 may be provided on one light source base member, or three or more light source base members.

The sensor base member 21 is electrically coupled to a control substrate 121 through a flexible printed circuit board 71. The flexible printed circuit board 71 is provided with the AFE circuit 48. The control substrate 121 is provided with the control circuit 122 and the power supply circuit 123.

The control circuit 122 includes, for example, a control integrated circuit (IC) that outputs logic control signals. The control circuit 122 may be, for example, a programmable logic device (PLD) such as a field-programmable gate array (FPGA).

The control circuit 122 performs processes related to a detection operation and an operation to calibrate a sensor power supply potential VDDSNS to be described later in the detection device 1. The control circuit 122 supplies control signals to the sensor area 10, the gate line drive circuit 15, and the signal line selection circuit 16 to control the detection operation in the sensor area 10. The control circuit 122 also supplies control signals to the first and the second light sources 61 and 62 to control lighting and non-lighting of the first and the second light sources 61 and 62.

In the present disclosure, the control circuit 122 generates and outputs a sensor power supply control signal VDDSNSCTRL (to be described later) to the power supply circuit 123.

The power supply circuit 123 supplies voltage signals including, for example, the sensor power supply potential VDDSNS (refer to FIG. 4) to the sensor area 10, the gate line drive circuit 15, and the signal line selection circuit 16. The power supply circuit 123 also supplies a power supply voltage to the first and the second light sources 61 and 62.

The sensor base member 21 has a detection area AA and a peripheral area GA. The detection area AA is an area in which a plurality of optical sensors PD (organic photodiodes) PD (refer to FIG. 4) included in the sensor area 10 are provided in a matrix having a row-column configuration. The peripheral area GA is an area between the outer perimeter of the detection area AA and the ends of the sensor base member 21, and is an area not provided with the optical sensors PD.

The gate line drive circuit 15 and the signal line selection circuit 16 are provided in the peripheral area GA. Specifically, the gate line drive circuit 15 is provided in an area extending along the second direction Dy in the peripheral area GA. The signal line selection circuit 16 is provided in an area extending along a first direction Dx in the peripheral area GA and is provided between the sensor area 10 and the AFE circuit 48.

The first direction Dx is one direction in a plane parallel to the sensor base member 21. The second direction Dy is one direction in the plane parallel to the sensor base member 21 and is a direction orthogonal to the first direction Dx. The second direction Dy may non-orthogonally intersect the first direction Dx. A third direction Dz is a direction orthogonal to the first direction Dx and the second direction Dy, and is a direction normal to the sensor base member 21.

The first light sources 61 are provided on the first light source base member 51, and are arranged along the second direction Dy. The second light sources 62 are provided on the second light source base member 52, and are arranged along the second direction Dy. The first light source base member 51 and the second light source base member 52 are electrically coupled, through terminals 124 and 125 provided on the control substrate 121, to the control circuit 122 and the power supply circuit 123.

For example, inorganic light-emitting diodes (LEDs) or organic electroluminescent (EL) diodes (organic light-emitting diodes (OLEDs)) are used as the first and the second light sources 61 and 62.

Light emitted from the first and the second light sources 61 and 62 is mainly reflected on a surface or inside of an object to be detected, such as a finger Fg, and is incident on the sensor area 10. Through this operation, the sensor area 10 can detect a shape of asperities on the surface of the finger Fg or the like, and information on a living body (hereinafter, also called "biometric information") in the finger Fg or the like. Examples of the biometric information include pulse waves, pulsation, and a vascular image of the finger Fg or a palm. That is, the detection device 1 may be configured as a fingerprint detection device to detect a fingerprint or a vein detection device to detect a vascular pattern of, for example, veins.

In an aspect of the present disclosure, the light emitted from the first light sources 61 and the light emitted from the second light sources 62 may have different wavelengths from each other. Thus, the detection device 1 can detect the various information on the living body by performing the detection based on the light emitted from the first light sources 61 and the detection based on the light emitted from the second light sources 62.

The arrangement of the first and the second light sources 61 and 62 illustrated in FIG. 1 is merely an example, and may be changed as appropriate. The detection device 1 is provided with a plurality of types of light sources (first and second light sources 61 and 62) as the light sources. However, the light sources are not limited thereto, and may be of one type. For example, the first and the second light sources 61 and 62 may be arranged on each of the first and the second light source base members 51 and 52. The first and the second light sources 61 and 62 may be provided on one light source base member, or three or more light source base members. Alternatively, only at least one light source needs to be disposed. The light source may be, for example, what is called a direct-type backlight that is provided directly below the detection area AA.

Figure 2:
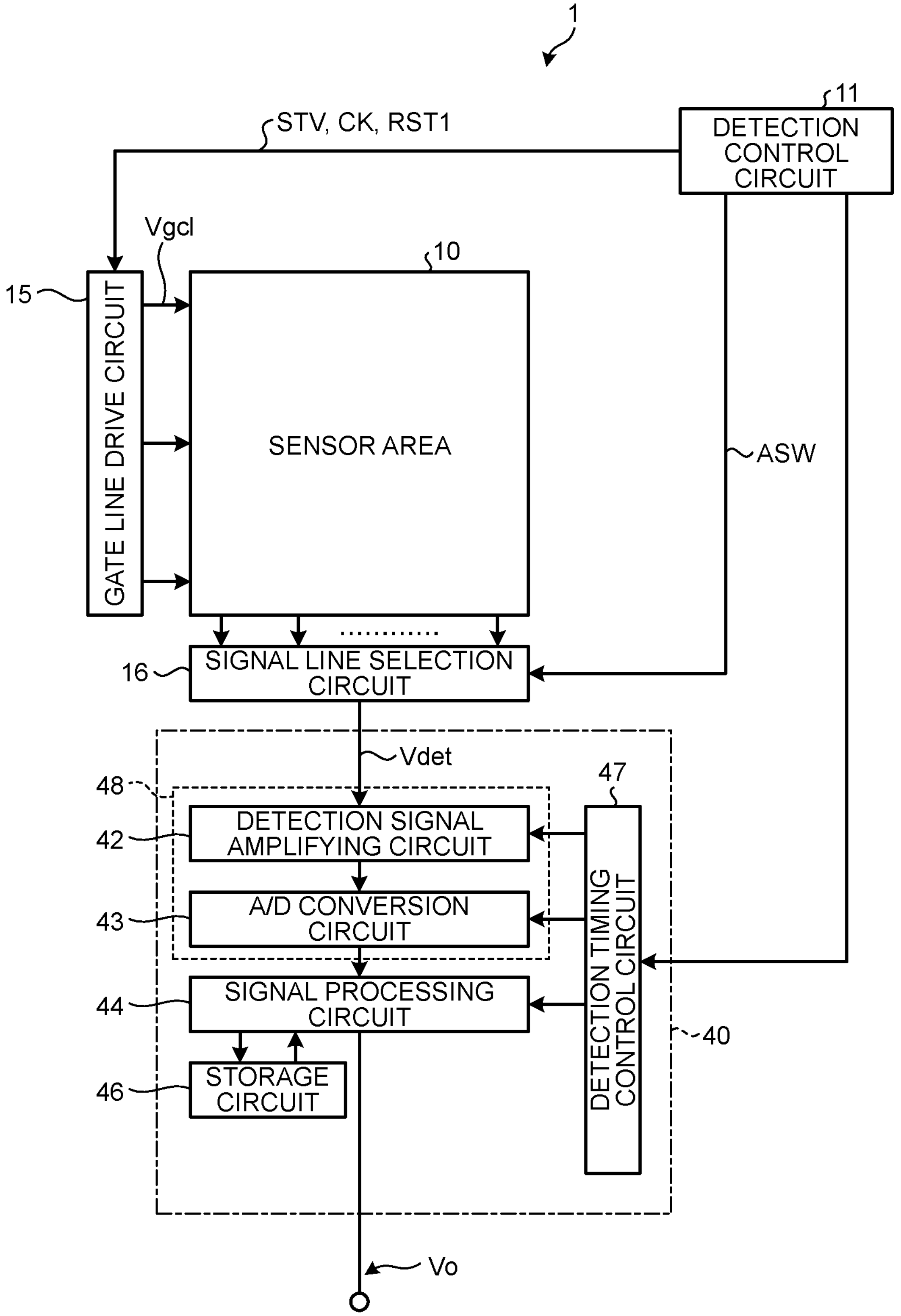
FIG. 2 is a block diagram illustrating a configuration example of the detection device according to the embodiment.

FIG. 2 is a block diagram illustrating a configuration example of the detection device according to the embodiment. As illustrated in FIG. 2, the detection device 1 further includes a detection control circuit 11 and a detection circuit 40.

The sensor area 10 includes the optical sensors PD. In the present disclosure, each of the optical sensors PD included in the sensor area 10 is an organic photodiode (OPD). The optical sensor PD outputs an electrical signal corresponding to light emitted thereto as a detection signal Vdet to the signal line selection circuit 16. The sensor area 10 performs the detection in response to a gate drive signal Vgcl supplied from the gate line drive circuit 15.

The detection control circuit 11 supplies respective control signals to the gate line drive circuit 15, the signal line selection circuit 16, and the detection circuit 40 to control operations of these circuits. The detection control circuit 11 supplies various control signals including, for example, a start signal STV, a clock signal CK, and a reset signal RST1 to the gate line drive circuit 15. The detection control circuit 11 also supplies various control signals including, for example, a selection signal ASW to the signal line selection circuit 16. The detection control circuit 11 also supplies various control signals to the first and the second light sources 61 and 62 to control the lighting and the non-lighting of each group of the first and the second light sources 61 and 62.

The gate line drive circuit 15 drives a plurality of gate lines GCL (refer to FIG. 3) based on the various control signals. The gate line drive circuit 15 sequentially or simultaneously selects the gate lines GCL, and supplies the gate drive signals Vgcl to the selected gate lines GCL. Through this operation, the gate line drive circuit 15 selects the optical sensors PD coupled to the gate lines GCL.

Figure 3:
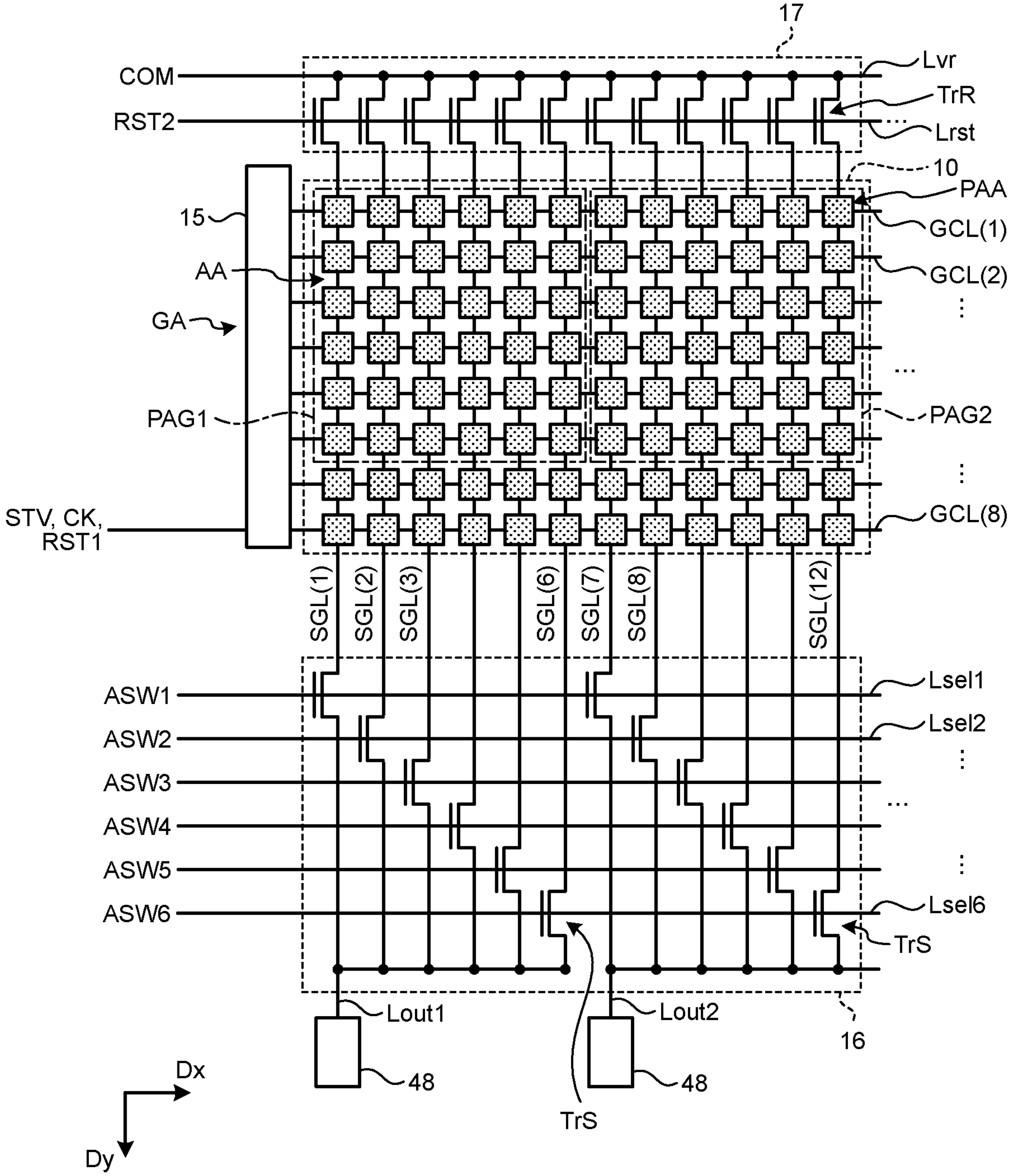
FIG. 3 is a circuit diagram illustrating the detection device according to the embodiment.

The signal line selection circuit 16 includes a switch circuit that sequentially or simultaneously selects a plurality of signal lines SGL (refer to FIG. 3). The signal line selection circuit 16 is, for example, a multiplexer. The signal line selection circuit 16 electrically couples the selected signal lines SGL to the AFE circuit 48 based on the selection signal ASW supplied from the detection control circuit 11. By this operation, the signal line selection circuit 16 outputs the detection signals Vdet of the optical sensors PD to the detection circuit 40.

The detection circuit 40 includes the AFE circuit 48, a signal processing circuit 44, a storage circuit 46, and a detection timing control circuit 47. The detection timing control circuit 47 performs control to cause the AFE circuit 48 and the signal processing circuit 44 to operate in synchronization with each other based on a control signal supplied from the detection control circuit 11.

The AFE circuit 48 is an analog front-end integrated circuit (IC), for example. The AFE circuit 48 is a signal processing circuit having functions of at least a detection signal amplifying circuit 42 and an analog-to-digital (A/D) conversion circuit 43. The detection signal amplifying circuit 42 amplifies the detection signal Vdet. The A/D conversion circuit 43 converts the analog signal output from the detection signal amplifying circuit 42 into a digital signal at a predetermined sampling period and outputs an AFE signal AFESIG (to be described later). As illustrated in FIG. 3 described later, the AFE circuit 48 is circuitry including a plurality of AFE circuits that are respectively provided for a plurality of output signal lines Lout. In the following descriptions, each of the plurality of AFE circuits included in the AFE circuit 48 as entire circuitry is given the same reference sign "48" and is referred to as the AFE circuit 48 in some cases.

In the present disclosure, the control circuit 122 includes the signal processing circuit 44 and the storage circuit 46.

The signal processing circuit 44 detects a predetermined physical quantity received by the sensor area 10 based on an output signal of the AFE circuit 48. The signal processing circuit 44 is a logic circuit. The signal processing circuit 44 can detect the asperities on the surface of the finger Fg or the palm based on the signals from the AFE circuit 48 when the finger Fg is in contact with or in proximity to a detection surface. The signal processing circuit 44 can detect the information on the living body based on the signals from the AFE circuit 48. Examples of the information on the living body include the vascular image, the pulse waves, the pulsation, and a blood oxygen level of the finger Fg or the palm.

The signal processing circuit 44 may also perform processing of acquiring the detection signals Vdet (information on the living body) simultaneously detected by the optical sensors PD, and averaging the detection signals Vdet. In this case, the detection circuit 40 can perform stable detection by reducing measurement errors that would be caused by noise or relative positional misalignment between the object to be detected, such as the Fg finger, and the sensor area 10.

The storage circuit 46 temporarily stores therein the signals processed by the signal processing circuit 44. In the present disclosure, the storage circuit 46 also stores therein information on a biometric data acquisition area that is set in a biometric data acquisition area setting process flow (to be described later) when the signal processing circuit 44 acquires the biometric data, and stores therein various types of setting information. In an aspect of the present disclosure, the storage circuit 46 may include, for example, a random-access memory (RAM), a read-only memory (ROM), and an electrically erasable programmable read-only memory (EEPROM). The storage circuit 46 may be a register circuit, for example.

The following describes a circuit configuration example of the detection device 1. FIG. 3 is a circuit diagram illustrating the detection device according to the embodiment. As illustrated in FIG. 3, the sensor area 10 has a plurality of partial detection areas PAA arranged in a matrix having a row-column configuration. Each of the partial detection areas PAA is provided with the optical sensor PD.

The gate lines GCL extend in the first direction Dx, and are each coupled to the partial detection areas PAA arranged in the first direction Dx. A plurality of gate lines GCL(1), GCL(2), . . . , GCL(8) are arranged in the second direction Dy, and are each coupled to the gate line drive circuit 15. In the following description, the gate lines GCL(1), GCL(2), . . . , GCL(8) will each be simply referred to as the gate line GCL when they need not be distinguished from one another. For ease of understanding of the description, FIG. 3 illustrates eight gate lines GCL. However, this is merely an example, and M gate lines GCL may be arranged (where M is a natural number, such as 256).

The signal lines SGL extend in the second direction Dy, and are each coupled to the optical sensors PD of the partial detection areas PAA arranged in the second direction Dy. A plurality of signal lines SGL(1), SGL(2), . . . , SGL(12) are arranged in the first direction Dx, and are each coupled to the signal line selection circuit 16 and a reset circuit 17. In the following description, the signal lines SGL(1), SGL(2), . . . , SGL(12) will each be simply referred to as the signal line SGL when they need not be distinguished from one another.

For ease of understanding of the description, FIG. 3 illustrates 12 signal lines SGL. However, this is merely an example, and N signal lines SGL may be arranged (where N is a natural number, such as 252). Specifically, 126 signal lines SGL are exemplified, but the number may be larger or smaller.

In FIG. 3, the sensor area 10 is provided between the signal line selection circuit 16 and the reset circuit 17. The signal line selection circuit 16 and the reset circuit 17 are not limited to being provided in this manner, but may be coupled to ends of the signal lines SGL in the same direction.

The gate line drive circuit 15 receives the various control signals such as the start signal STV, the clock signal CK, and the reset signal RST1 from the control circuit 122 (refer to FIG. 1). The gate line drive circuit 15 sequentially selects the gate lines GCL(1), GCL(2), . . . , GCL(8) in a time-division manner based on the various control signals. The gate line drive circuit 15 supplies the gate drive signal Vgcl to the selected one of the gate lines GCL. This operation supplies the gate drive signal Vgcl to a plurality of first switching elements Tr coupled to the gate line GCL, and corresponding partial detection areas PAA arranged in the first direction Dx are selected as detection targets.

The gate line drive circuit 15 may perform different driving for each of detection modes including the detection of a fingerprint and the detection of a plurality of different items of the biometric information (such as the pulse waves, the pulsation, the vascular image, and the blood oxygen level). For example, the gate line drive circuit 15 may collectively drive more than one of the gate lines GCL.

Specifically, the gate line drive circuit 15 simultaneously selects a predetermined number of the gate lines GCL from among the gate lines GCL(1), GCL(2), . . . , GCL(8) based on the control signals. For example, the gate line drive circuit 15 simultaneously selects six gate lines GCL(1) to GCL(6) and supplies thereto the gate drive signals Vgcl. The gate line drive circuit 15 supplies the gate drive signals Vgcl through the selected six gate lines GCL to the first switching elements Tr. By this operation, block units PAG1 and PAG2 each including more than one of the partial detection areas PAA arranged in the first direction Dx and the second direction Dy are selected as the detection targets. The gate line drive circuit 15 collectively drives the predetermined number of the gate lines GCL and sequentially supplies the gate drive signals Vgcl to each unit of the predetermined number of the gate lines GCL.

The signal line selection circuit 16 includes a plurality of selection signal lines Lsel, the plurality of output signal lines Lout, and third switching elements TrS. The third switching elements TrS are provided correspondingly to the signal lines SGL. Six signal lines SGL(1), SGL(2), . . . , SGL(6) are coupled to a common output signal line Lout1. Six signal lines SGL(7), SGL(8), . . . , SGL(12) are coupled to a common output signal line Lout2. The output signal lines Lout1 and Lout2 are each coupled to the AFE circuit 48.

The signal lines SGL(1), SGL(2), . . . , SGL(6) are grouped into a first signal line block, and the signal lines SGL(7), SGL(8), . . . , SGL(12) are grouped into a second signal line block. The selection signal lines Lsel are coupled to the gates of the respective third switching elements TrS included in one of the signal line blocks. One of the selection signal lines Lsel is coupled to the gates of the third switching elements TrS in the signal line blocks.

Specifically, selection signal lines Lsel1, Lsel2, . . . , Lsel6 are coupled to the third switching elements TrS corresponding to the signal lines SGL(1), SGL(2), . . . , SGL(6), respectively. The selection signal line Lsel1 is coupled to the third switching element TrS corresponding to the signal line SGL(1) and the third switching element TrS corresponding to the signal line SGL(7). The selection signal line Lsel2 is coupled to the third switching element TrS corresponding to the signal line SGL(2) and the third switching element TrS corresponding to the signal line SGL(8).

The control circuit 122 (refer to FIG. 1) sequentially supplies the selection signal ASW to the selection signal lines Lsel. This operation causes the signal line selection circuit 16 to operate the third switching elements TrS to sequentially select the signal lines SGL in one of the signal line blocks in a time-division manner. The signal line selection circuit 16 selects one of the signal lines SGL in each of the signal line blocks. With the configuration described above, the detection device 1 can reduce the number of integrated circuits (ICs) including the AFE circuit 48 or the number of terminals of the ICs.

The signal line selection circuit 16 may collectively couple more than one of the signal lines SGL to the AFE circuit 48. Specifically, the control circuit 122 (refer to FIG. 1) simultaneously supplies the selection signal ASW to the selection signal lines Lsel. The signal line selection circuit 16 operates the third switching elements TrS to select the signal lines SGL (for example, six of the signal lines SGL) in one of the signal line blocks, and couples the signal lines SGL to the AFE circuit 48. By this operation, signals detected in each of the block units PAG1 and PAG2 are output to the AFE circuit 48. In this case, the signals from the partial detection areas PAA (optical sensors PD) included in each of the block units PAG1 and PAG2 are integrated and output to the AFE circuit 48.

The detection is performed for each of the block units PAG1 and PAG2 by the operations of the gate line drive circuit 15 and the signal line selection circuit 16. As a result, the strength of the detection signal Vdet obtained by a one-time detection operation increases, so that the sensor sensitivity can be improved.

As illustrated in FIG. 3, the reset circuit 17 includes a reference signal line Lvr, a reset signal line Lrst, and fourth switching elements TrR. The fourth switching elements TrR are provided correspondingly to the signal lines SGL. The reference signal line Lvr is coupled to either the sources or the drains of the fourth switching elements TrR. The reset signal line Lrst is coupled to the gates of the fourth switching elements TrR.

The control circuit 122 supplies a reset signal RST2 to the reset signal line Lrst. This operation turns on the fourth switching elements TrR to electrically couple the signal lines SGL to the reference signal line Lvr. The power supply circuit 123 supplies a reference signal COM to the reference signal line Lvr. This operation supplies the reference signal COM to a capacitive element Ca (refer to FIG. 4) included in each of the partial detection areas PAA. In the present disclosure, the potential of the reference signal COM is 0.75 V, for example.

Figure 4:
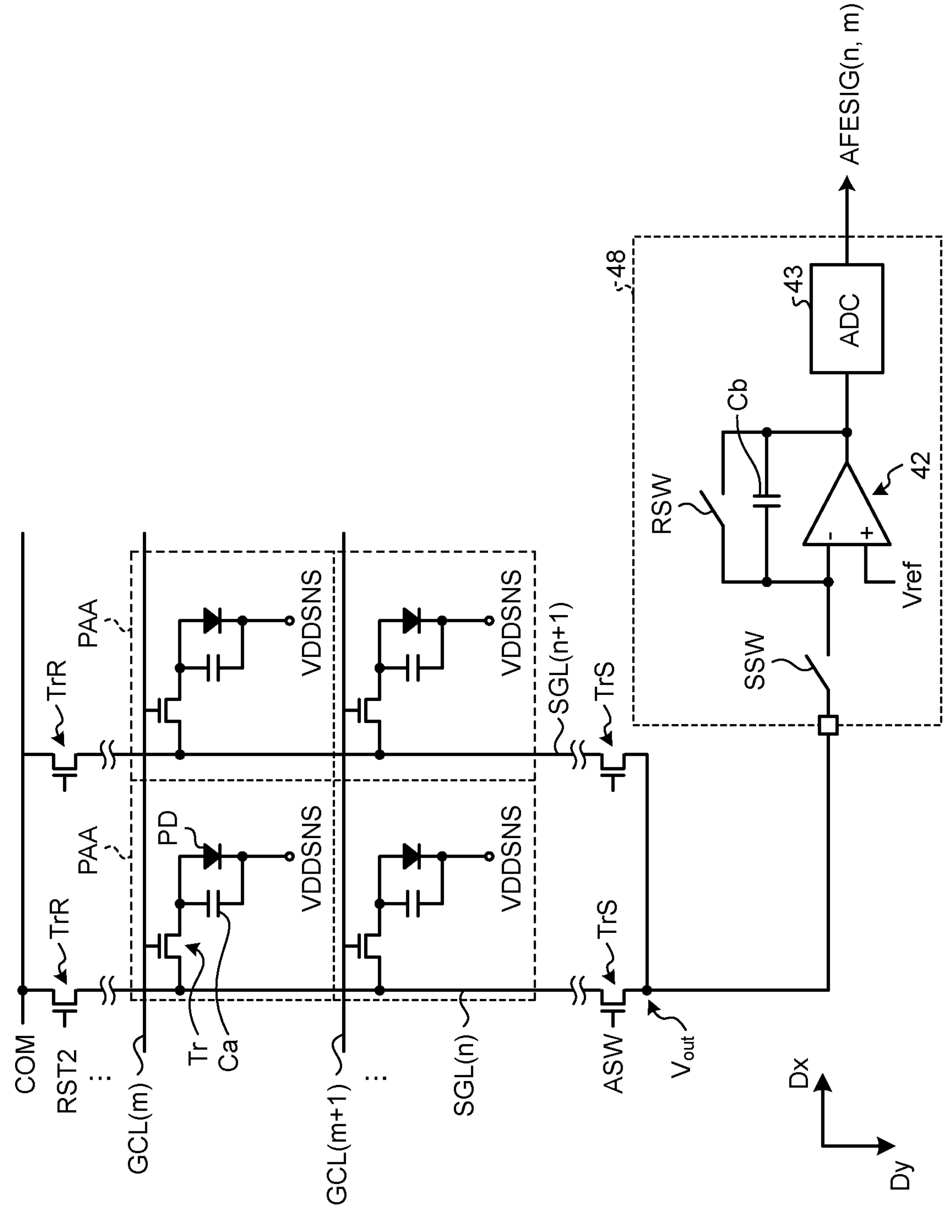
FIG. 4 is a circuit diagram illustrating a plurality of partial detection areas.

FIG. 4 is a circuit diagram illustrating the partial detection areas of the detection device according to the embodiment. FIG. 4 also illustrates a circuit configuration of the AFE circuit 48. As illustrated in FIG. 4, each of the partial detection areas PAA includes the optical sensor PD, the capacitive element Ca, and a corresponding one of the first switching elements Tr. The capacitive element Ca is capacitance (sensor capacitance) generated in the optical sensor PD, and is equivalently coupled in parallel to the optical sensor PD.

FIG. 4 illustrates two gate lines GCL(m) and GCL(m+1) arranged in the second direction Dy among the gate lines GCL. FIG. 4 also illustrates two signal lines SGL(n) and SGL(n+1) arranged in the first direction Dx among the signal lines SGL. The partial detection area PAA is an area surrounded by the gate lines GCL and the signal lines SGL.

Each of the first switching elements Tr is provided correspondingly to the optical sensor PD. The first switching element Tr is formed of a thin-film transistor, and in this example, formed of an n-channel metal oxide semiconductor (MOS) thin-film transistor (TFT).

The gates of the first switching elements Tr belonging to the partial detection areas PAA arranged in the first direction Dx are coupled to the gate line GCL. The sources of the first switching elements Tr belonging to the partial detection areas PAA arranged in the second direction Dy are coupled to the signal line SGL. The drain of the first switching element Tr is coupled to the cathode of the optical sensor PD and the capacitive element Ca.

The anode of the optical sensor PD is supplied with the sensor power supply potential VDDSNS from the power supply circuit 123. The cathode of the optical sensor PD and the capacitive element Ca are supplied with the reference signal COM that serves as an initial potential of the signal line SGL and the capacitive element Ca from the power supply circuit 123.

In the present disclosure, the sensor power supply potential VDDSNS is a variable potential having a normal potential of 2.75 V, for example. In the present disclosure, the potential of the reference signal COM is, for example, 0.75 V, as described above. That is, the potential difference between the potential of the reference signal COM and the sensor power supply potential VDDSNS is applied to the optical sensor PD. By this operation, a reverse bias is applied between the anode and the cathode of the optical sensor PD.

When the partial detection area PAA is irradiated with light, a current corresponding to the amount of the light flows through the optical sensor PD. As a result, an electric charge corresponding to the amount of the light is stored in the capacitive element Ca. After the first switching element Tr is turned on, a current corresponding to the electric charge stored in the capacitive element Ca flows through the signal line SGL. The signal line SGL is coupled to the AFE circuit 48 through a corresponding one of the third switching elements TrS of the signal line selection circuit 16. By this operation, the detection device 1 can detect a signal corresponding to the amount of the light received by the optical sensor PD in each of the partial detection areas PAA or signals corresponding to the amounts of the light received by the optical sensors PD in each of the block units PAG1 and PAG2.

During a read period Pdet (refer to FIG. 6), a switch SSW of the AFE circuit 48 is turned on to couple the AFE circuit 48 to the signal lines SGL. The detection signal amplifying circuit 42 of the AFE circuit 48 converts a current supplied from the signal line SGL into a voltage corresponding to the value of the current, and amplifies the result. A reference potential (Vref) having a fixed potential is supplied to a non-inverting input terminal (+) of the detection signal amplifying circuit 42, and the signal lines SGL are coupled to an inverting input terminal (−) of the detection signal amplifying circuit 42. In the embodiment, the same signal as the reference signal COM is supplied as the reference potential (Vref) voltage. The detection signal amplifying circuit 42 includes a capacitive element Cb and a reset switch RSW. During a reset period Prst (refer to FIG. 6), the reset switch RSW is turned on, and the electric charge of the capacitive element Cb is reset.

Figure 5:
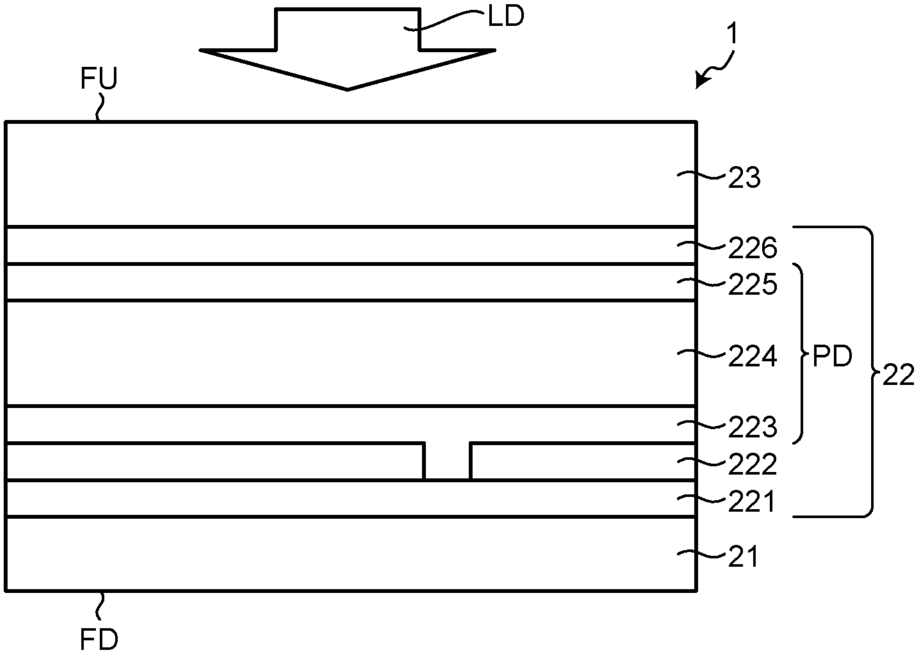
FIG. 5 is a partial sectional view of an optical sensor according to the embodiment.

The following describes a configuration example of the optical sensor PD. FIG. 5 is a partial sectional view of the optical sensor according to the embodiment. The sensor area 10 of the detection device 1 includes the sensor base member 21, a sensor structure 22, and a protective film 23.

The sensor structure 22 includes a TFT layer 221, a cathode electrode (lower electrode) 222, the optical sensor PD, and an anode electrode (upper electrode) 226. The optical sensor PD detects first light LD incident from a second surface FU side.

The TFT layer 221 is provided with various types of wiring such as the gate line GCL and the signal line SGL. The sensor base member 21 and the TFT layer 221 serve as a drive circuit that drives the sensor and are also called a backplane.

The optical sensor PD includes an active layer 224, a hole transport layer (lower buffer layer) 223 provided between the active layer 224 and the cathode electrode (lower electrode) 222, and an electron transport layer (upper buffer layer) 225 provided between the active layer 224 and the anode electrode (upper electrode) 226. In other words, the hole transport layer (lower buffer layer) 223, the active layer 224, and the electron transport layer (upper buffer layer) 225 of the optical sensor PD are stacked in this order in a direction orthogonal to the sensor base member 21.

The active layer 224 changes in characteristics (for example, voltage-current characteristics and resistance value) according to light that illuminates the active layer 224. An organic material is used as a material of the active layer 224. Specifically, the active layer 224 has a bulk heterostructure containing a mixture of a p-type organic semiconductor and an n-type fullerene derivative (PCBM) that is an n-type organic semiconductor. As the active layer 224, low-molecular-weight organic materials can be used, such as fullerene ($C_{60}$), phenyl-$C_{61}$-butyric acid methyl ester (PCBM), copper phthalocyanine (CuPc), fluorinated copper phthalocyanine ($F_{16}CuPc$), 5,6,11,12-tetraphenyltetracene (rubrene), and perylene diimide (PDI) (derivative of perylene).

The active layer 224 can be formed by a vapor deposition process (dry process) using the low-molecular-weight organic materials listed above. In this case, the active layer 224 may be, for example, a multilayered film of CuPc and $F_{16}CuPc$, or a multilayered film of rubrene and $C_{60}$. The active layer 224 can also be formed by a coating process (wet process). In this case, the active layer 224 is made using a material obtained by combining the above-listed low-molecular-weight organic materials with a high-molecular-weight organic material. As the high-molecular-weight organic material, for example, poly(3-hexylthiophene) (P3HT) and F8-alt-benzothiadiazole (F8BT) can be used. The active layer 224 can be a film made of a mixture of P3HT and PCBM, or a film made of a mixture of F8BT and PDI.

The hole transport layer (lower buffer layer) 223 and the electron transport layer (upper buffer layer) 225 are provided to facilitate electrons and holes generated in the active layer 224 to reach the cathode electrode (lower electrode) 222 or the anode electrode (upper electrode) 226. The hole transport layer (lower buffer layer) 223 is in direct contact with the top of the cathode electrode (lower electrode) 222. The active layer 224 is in direct contact with the top of the hole transport layer (lower buffer layer) 223.

The electron transport layer (upper buffer layer) 225 is in direct contact with the top of the active layer 224, and the anode electrode (upper electrode) 226 is in direct contact with the top of the electron transport layer (upper buffer layer) 225.

The cathode electrode (lower electrode) 222 faces the anode electrode (upper electrode) 226 with the optical sensor PD interposed therebetween. A light-transmitting conductive material such as indium tin oxide (ITO) or indium zinc oxide (IZO) is used as the anode electrode (upper electrode) 226. A metal material such as silver (Ag) or aluminum (Al) is used as the cathode electrode (lower electrode) 222. Alternatively, the cathode electrode (lower electrode) 222 may be made of an alloy material containing at least one or more of these metal materials.

The protective film 23 is provided on the second surface FU so as to cover the anode electrode (upper electrode) 226. The protective film 23 is a passivation film provided to protect the optical sensor PD.

FIG. 4 illustrates the configuration in which the anode of the optical sensor PD is supplied with the reference signal COM serving as the initial potential of the signal line SGL and the capacitive element Ca from the power supply circuit 123, and the cathode of the optical sensor PD is supplied with the sensor power supply potential VDDSNS from the power supply circuit 123. However, for example, a configuration may be employed in which the cathode of the optical sensor PD is supplied with the reference signal COM serving as the initial potential of the signal line SGL and the capacitive element Ca from the power supply circuit 123, and the anode of the optical sensor PD is supplied with the sensor power supply potential VDDSNS from the power supply circuit 123. In that case, unlike the configuration described above, the optical sensor PD includes the active layer 224, an electron transport layer (lower buffer layer) 223 provided between the active layer 224 and an anode electrode (lower electrode) 222, and a hole transport layer (upper buffer layer) 225 provided between the active layer 224 and a cathode electrode (upper electrode) 226. In other words, the electron transport layer (lower buffer layer) 223, the active layer 224, and the hole transport layer (upper buffer layer) 225 of the optical sensor PD are stacked in this order in the direction orthogonal to the sensor base member 21.

Figure 6:
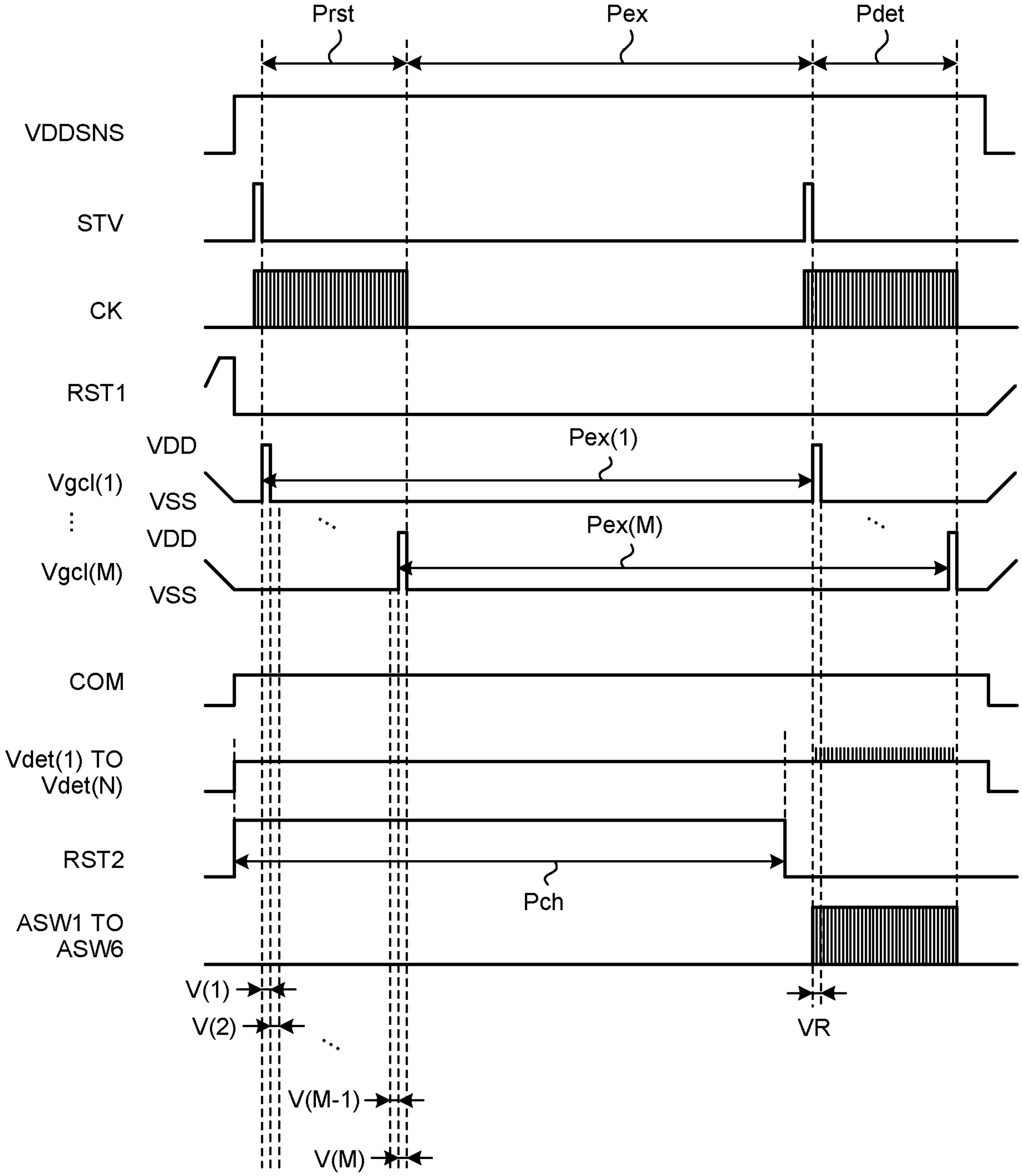
FIG. 6 is a timing waveform diagram illustrating an operation example of the detection device according to the embodiment.
Figure 7:
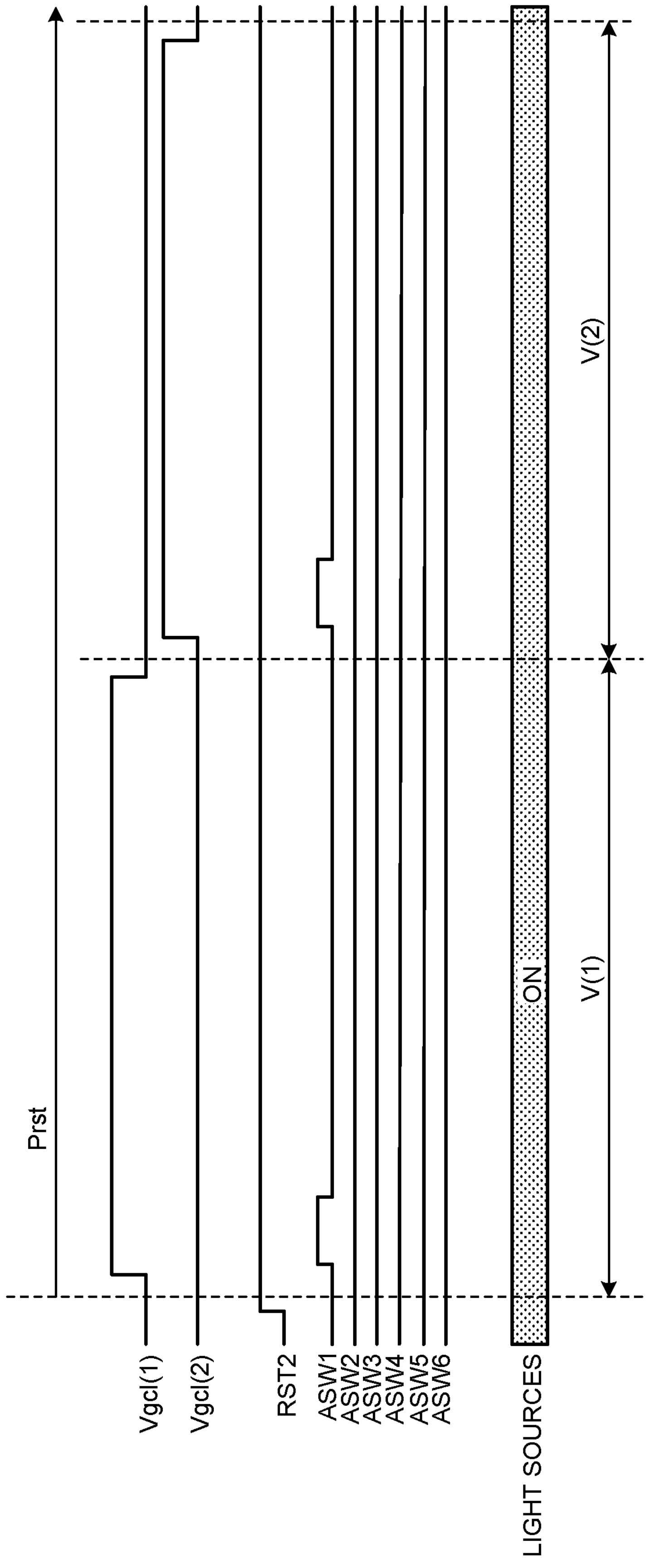
FIG. 7 is a timing waveform diagram illustrating an operation example during a reset period in FIG. 6.
Figure 8:
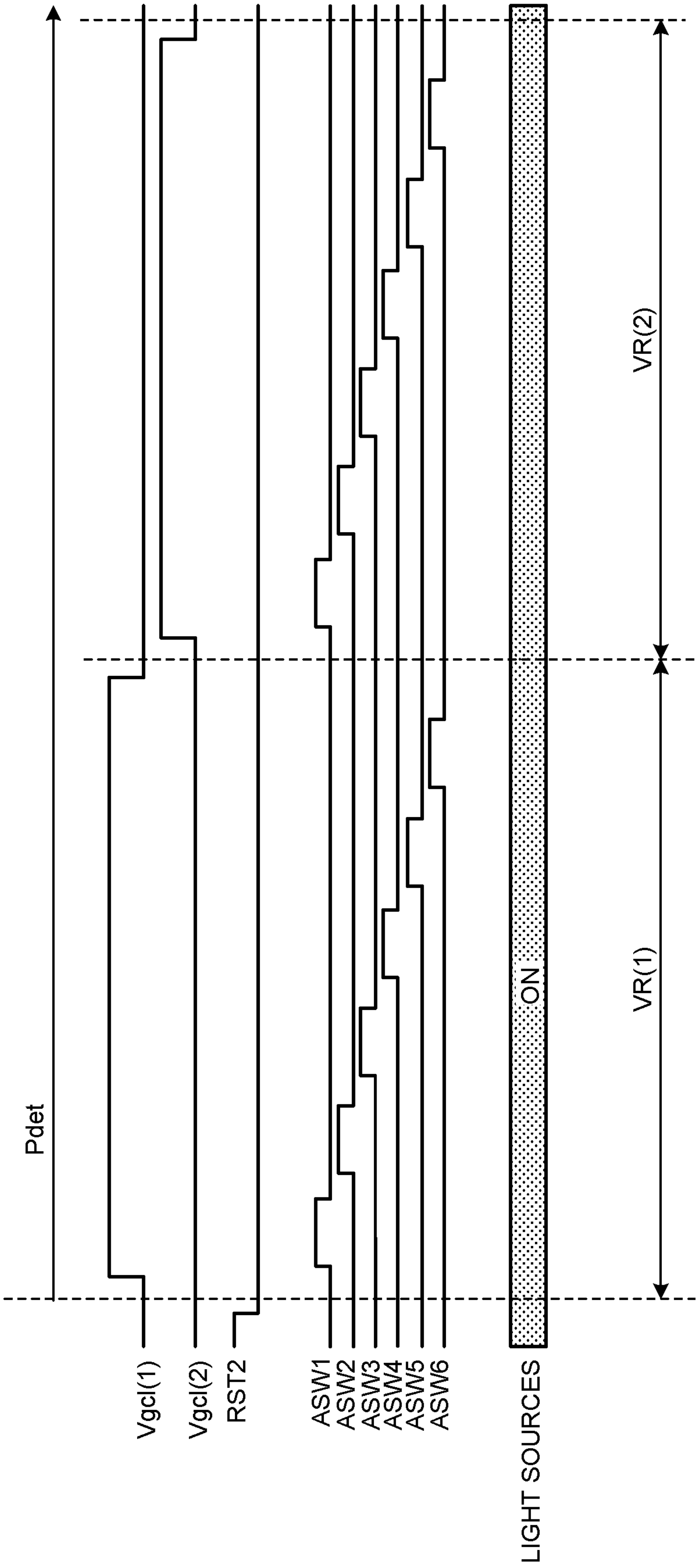
FIG. 8 is a timing waveform diagram illustrating an operation example during a read period in FIG. 6.
Figure 9:
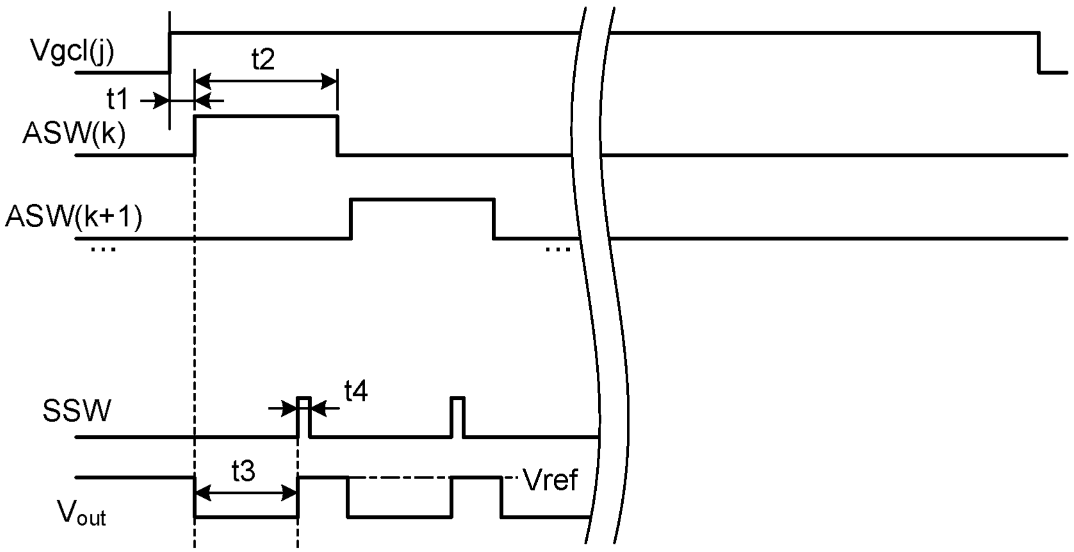
FIG. 9 is a timing waveform diagram illustrating an operation example during a drive period of one gate line included in the read period in FIG. 6.
Figure 10:
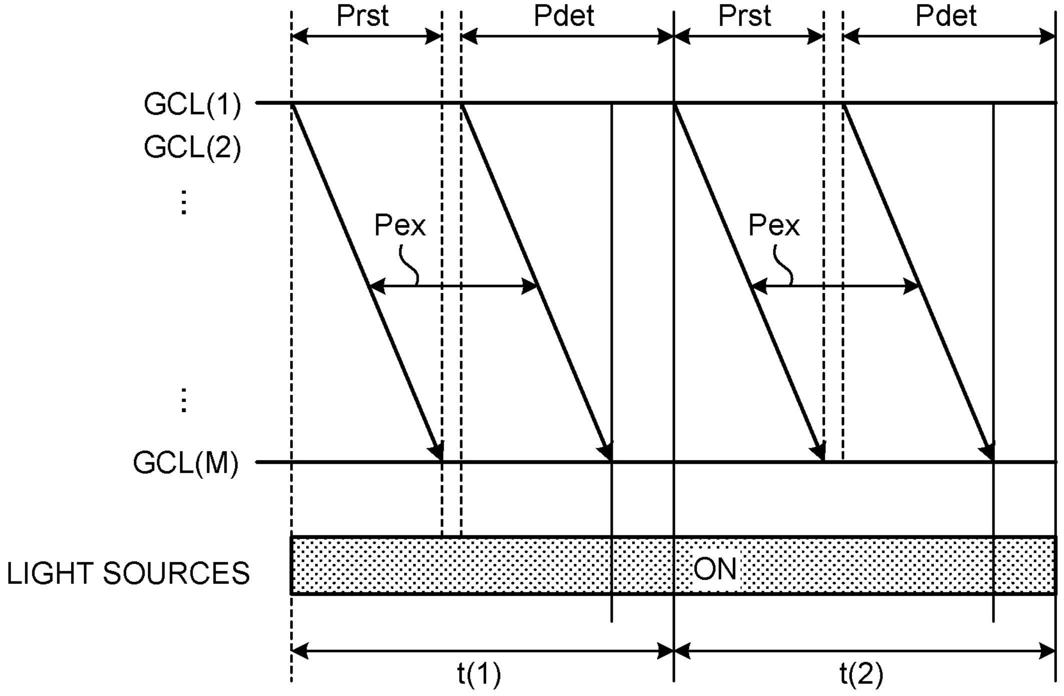
FIG. 10 is an explanatory diagram for explaining a relation between driving of a sensor area and a lighting operation of light sources in the detection device according to the embodiment.

The following describes an operation example of the detection device 1. FIG. 6 is a timing waveform diagram illustrating an operation example of the detection device according to the embodiment. FIG. 7 is a timing waveform diagram illustrating an operation example during the reset period in FIG. 6. FIG. 8 is a timing waveform diagram illustrating an operation example during the read period in FIG. 6. FIG. 9 is a timing waveform diagram illustrating an operation example during a drive period of one gate line included in a row read period VR in FIG. 6. FIG. 10 is an explanatory diagram for explaining a relation between driving of the sensor area and a lighting operation of the light sources in the detection device according to the embodiment.

As illustrated in FIG. 6, the detection device 1 has the reset period Prst, an exposure period Pex, and the read period Pdet. The power supply circuit 123 supplies the sensor power supply potential VDDSNS to the anode of the optical sensor PD over the reset period Prst, the exposure period Pex, and the read period Pdet. The detection device 1 repeats the detection operation for one frame illustrated in FIG. 6 a plurality of times to detect the object to be detected in the detection area AA and the biometric information on the object to be detected. Hereinafter, the process of detecting the object to be detected and the biometric information on the object to be detected in the detection device 1 is also called "detection process".

The sensor power supply potential VDDSNS is a signal that applies the reverse bias between the anode and the cathode of the optical sensor PD. For example, the reference signal COM of substantially 0.75 V is applied to the anode of the optical sensor PD. By applying, for example, the sensor power supply potential VDDSNS of substantially 2.75 V to the cathode of the optical sensor PD, a reverse bias of substantially 2.0 V is applied between the anode and the cathode. The control circuit 122 sets the reset signal RST2 to "H", and then, supplies the start signal STV and the clock signal CK to the gate line drive circuit 15 to start the reset period Prst. During the reset period Prst, the control circuit 122 supplies the reference signal COM to the reset circuit 17 and uses the reset signal RST2 to turn on the fourth switching elements TrR for supplying a reset voltage. This operation supplies the reference signal COM as the reset voltage to each of the signal lines SGL.

During the reset period Prst, the gate line drive circuit 15 sequentially selects the gate lines GCL based on the start signal STV, the clock signal CK, and the reset signal RST1. The gate line drive circuit 15 sequentially supplies gate drive signals Vgcl {Vgcl(1), . . . , Vgcl(M)} to the gate lines GCL. Each of the gate drive signals Vgcl has a pulsed waveform having a power supply voltage VDD serving as a high-level voltage and a power supply voltage VSS serving as a low-level voltage.

FIG. 6 illustrates an example in which M gate lines GCL (for example, M=256) are provided. In the reset period, the gate drive signals Vgcl(1), . . . , Vgcl(M) are sequentially supplied to the respective gate lines GCL. Thus, the first switching elements Tr are sequentially brought into a conducting state and supplied with the reset voltage on a row-by-row basis. For example, a voltage of 0.75 V of the reference signal COM is supplied as the reset voltage.

Specifically, as illustrated in FIG. 7, the gate line drive circuit 15 supplies the gate drive signal Vgcl(1) at the high-level voltage (power supply voltage VDD) to the gate line GCL(1) during a period V(1). The control circuit 122 supplies at least one of the selection signals ASW1, . . . , ASW6 (selection signal ASW1 in FIG. 7) to the signal line selection circuit 16 while the gate drive signal Vgcl(1) is kept at the high-level voltage (power supply voltage VDD). This operation couples the signal lines SGL of the partial detection areas PAA selected by the selection signal ASW1 to the AFE circuit 48. As a result, the reset voltage (reference signal COM) is also supplied to coupling wiring between the third switching elements TrS and the AFE circuit 48.

In the same manner, the gate line drive circuit 15 supplies the gate drive signals Vgcl(2), . . . , Vgcl(M−1), Vgcl(M) at the high-level voltage to gate lines GCL(2), . . . , GCL(M−1), GCL(M) during periods V(2), . . . , V(M−1), V(M), respectively.

Through this operation, during the reset period Prst, the capacitive elements Ca of all the partial detection areas PAA are sequentially electrically coupled to the signal lines SGL, and are supplied with the reference signal COM. As a result, the capacitance of the capacitive elements Ca is reset. The capacitance of the capacitive elements Ca of some of the partial detection areas PAA can be reset by partially selecting the gate lines and the signal lines SGL.

Examples of the method of controlling the exposure include a method of controlling the exposure during non-selection of the gate lines and a method of always controlling the exposure.

In the method of controlling the exposure during non-selection of the gate lines, the gate drive signals {Vgcl(1), . . . , Vgcl(M)} are sequentially supplied to all the gate lines GCL coupled to the optical sensors PD serving as the detection targets, and all the optical sensors PD serving as the detection targets are supplied with the reset voltage. Then, after all the gate lines GCL coupled to the optical sensors PD serving as the detection targets are set to a low voltage (the first switching elements Tr are turned off), the exposure starts and the exposure is performed during the exposure period Pex. After the exposure ends, the gate drive signals {Vgcl(1), . . . , Vgcl(M)} are sequentially supplied to the gate lines GCL coupled to the optical sensors PD serving as the detection targets as described above, and reading is performed during the read period Pdet.

In the method of always controlling the exposure, the control for performing the exposure can also be performed during the reset period Prst and the read period Pdet (the exposure is always controlled). In this case, the exposure period Pex(1) starts after the gate drive signal Vgcl(1) is supplied to the gate line GCL(1) during the reset period Prst. The exposure periods Pex {(1), . . . , (M)} are actual exposure periods and are periods during which the capacitive elements Ca are charged from the optical sensors PD and do not includes any periods in which light is emitted, other than these periods. The electric charge stored in the capacitive element Ca during the reset period Prst causes a reverse-directional current (from cathode to anode) to flow through the optical sensor PD due to light irradiation, and the potential difference in the capacitive element Ca decreases. The start timings and the end timings of the actual exposure periods Pex(1), . . . , Pex(M) for the partial detection areas PAA corresponding to the gate lines GCL are different between the exposure periods Pex. Each of the exposure periods Pex(1), . . . , Pex(M) starts when the gate drive signal Vgcl changes from the power supply voltage VDD serving as the high-level voltage to the power supply voltage VSS serving as the low-level voltage in the reset period. Each of the exposure periods Pex(1), . . . , Pex(M) ends when the gate drive signal Vgcl changes from the power supply voltage VSS to the power supply voltage VDD in the read period Pdet. The lengths of the exposure time of the actual exposure periods Pex(1), . . . , Pex(M) in the partial detection areas PAA corresponding to the gate lines GCL are equal to one another.

During the exposure periods Pex {(1) . . . (M)}, a current flows correspondingly to the light irradiating the optical sensor PD of each of the partial detection areas PAA. As a result, an electric charge is stored in each of the capacitive elements Ca.

At a time before the read period Pdet starts, the control circuit 122 sets the reset signal RST2 to a low-level voltage. This operation stops the operation of the reset circuit 17. The reset signal may be set to a high-level voltage only during the reset period Prst. During the read period Pdet, the gate line drive circuit 15 sequentially supplies the gate drive signals Vgcl to the gate lines GCL in the same manner as during the reset period Prst.

Specifically, the gate line drive circuit 15 supplies the gate drive signal Vgcl(1) at the high-level voltage (power supply voltage VDD) to the gate line GCL(1) during a row read period VR(1) illustrated in FIG. 8. The control circuit 122 sequentially supplies the selection signals ASW1, . . . , ASW6 to the signal line selection circuit 16 while the gate drive signal Vgcl(1) is kept at the high-level voltage (power supply voltage VDD). This operation sequentially couples the signal lines SGL of the partial detection areas PAA selected by the gate drive signal Vgcl(1) to the AFE circuit 48. As a result, the detection signal Vdet for each of the partial detection areas PAA is supplied to the AFE circuit 48. A predetermined number of signals among the selection signals ASW1, . . . , ASW6 may be simultaneously supplied to the signal line selection circuit 16. In this case, the predetermined number of the signal lines SGL for the partial detection areas PAA selected by the gate drive signal Vgcl (1) are coupled to the AFE circuit 48.

In the same manner, the gate line drive circuit 15 supplies the gate drive signals Vgcl(2), . . . , Vgcl(M−1), Vgcl(M) at the high-level voltage to the gate lines GCL(2), . . . , GCL(M−1), GCL(M) during row read periods VR(2), . . . , VR(M−1), VR(M), respectively. That is, the gate line drive circuit 15 supplies the gate drive signal Vgcl to the gate line GCL in each of the row read periods VR(1), VR(2), . . . , VR(M−1), VR(M). The signal line selection circuit 16 sequentially or simultaneously selects the signal lines SGL based on the selection signal ASW during each period in which the gate drive signal Vgcl is set to the high-level voltage. In other words, the signal line selection circuit 16 sequentially or simultaneously couples the signal lines SGL to one AFE circuit 48. By this operation, the detection device 1 can output the detection signals Vdet of all the partial detection areas PAA to the AFE circuit 48 during the read period Pdet.

With reference to FIG. 9, the following describes an operation example during the row read period VR that is a supply period of one gate drive signal Vgcl(j) in FIG. 6. In FIG. 6, the reference numeral of the row read period VR is assigned to the first gate drive signal Vgcl(1). The same also applies to the other gate drive signals Vgcl(2), . . . , Vgcl(M). The index j is any one of the natural numbers 1 to M.

As illustrated in FIGS. 9 and 4, an output (Vout) of each of the third switching elements TrS has been reset to the reference potential (Vref) voltage in advance. The reference potential (Vref) voltage serves as the reset voltage, and is set to 0.75 V, for example. Then, the gate drive signal Vgcl(j) is set to a high level, and the first switching elements Tr of a corresponding row are turned on. Thus, each of the signal lines SGL in each row is set to a voltage corresponding to the electric charge stored in the capacitor (capacitive element Ca) of the partial detection area PAA.

After a period t1 elapses from a rising edge of the gate drive signal Vgcl(j), a period t2 starts in which the selection signal ASW(k) is set to a high level. After the selection signal ASW(k) is set to the high level and the third switching element TrS is turned on, the AFE circuit 48 is electrically coupled to the capacitor (capacitive element Ca) of the partial detection area PAA via the third switching element TrS. This operation changes the output (Vout) of the third switching element TrS (refer to FIG. 4) to a voltage corresponding to the electric charge stored in the capacitor (capacitive element Ca) of the partial detection area PAA (period t3). In the example of FIG. 9, this voltage is reduced from the reset voltage as illustrated in the period t3. Then, after the switch SSW is turned on (period t4 during which an SSW signal is set to a high level), the electric charge stored in the capacitor (capacitive element Ca) of the partial detection area PAA moves to the capacitor (capacitive element Cb) of the detection signal amplifying circuit 42 of the AFE circuit 48, and the output voltage of the detection signal amplifying circuit 42 is set to a voltage corresponding to the electric charge stored in the capacitive element Cb.

At this time, the potential of the inverting input portion of the detection signal amplifying circuit 42 is set to a virtual short-circuit potential of an operational amplifier, and therefore, becomes the reference potential (Vref). The A/D conversion circuit 43 reads the output voltage of the detection signal amplifying circuit 42. In the example illustrated in FIG. 9, the selection signals ASW(k), ASW(k+1), . . . corresponding to the signal lines SGL of the respective columns are sequentially set to a high level to sequentially turn on the third switching elements TrS, and the same operation is sequentially performed to sequentially read the electric charges stored in the capacitors (capacitive elements Ca) of the partial detection areas PAA coupled to each of the gate lines GCL. ASW(k), ASW(k+1), . . . illustrated in FIG. 9 are, for example, any of ASW1 to ASW6 illustrated in FIG. 8.

Specifically, after the switch SSW is turned on in the period t4, the electric charge moves from the capacitor (capacitive element Ca) of the partial detection area PAA to the capacitor (capacitive element Cb) of the detection signal amplifying circuit 42 of the AFE circuit 48. At this time, the reference potential (Vref) voltage (at 0.75 V, for example) is applied to the non-inverting input (+) of the detection signal amplifying circuit 42. As a result, the output (Vout) of the third switching element TrS is also set to the reference potential (Vref) voltage due to the virtual short-circuit between the inputs of the detection signal amplifying circuit 42. The voltage of the capacitive element Cb is set to a voltage corresponding to the electric charge stored in the capacitor (capacitive element Ca) of the partial detection area PAA at a location where the third switching element TrS is turned on in response to the selection signal ASW(k). After the output (Vout) of the third switching element TrS is set to the reference potential (Vref) voltage due to the virtual short-circuit, the output of the detection signal amplifying circuit 42 reaches a voltage corresponding to the capacitance of the capacitive element Cb. The A/D conversion circuit 43 reads the output voltage of the detection signal amplifying circuit 42 at this time. The voltage of the capacitive element Cb is, for example, a voltage between two electrodes provided on a capacitor constituting the capacitive element Cb.

In the example illustrated in FIG. 10, the detection device 1 executes the processing in the reset period Prst, the exposure periods Pex {(1), . . . , (M)}, and the read period Pdet described above, in each of a period t(1) and a period t(2). In the reset period Prst and the read period Pdet, the gate line drive circuit 15 sequentially scans the gate lines from GCL(1) to GCL(M). In the following description, "detection of one frame" denotes the detection in each period t, that is, the detection to acquire the detection signals Vdet from the signal lines SGL in the respective columns by scanning the gate lines GCL(1) to GCL(M) in the reset period Prst and the read period Pdet.

The light sources (the first light sources 61 or the second light sources 62) are continuously turned on during the periods t(1) and t(2). The control circuit 122 can control the lighting and the non-lighting of the light sources depending on the detection target. For example, the control circuit 122 may switch on and off the first and the second light sources 61 and 62 at intervals of a certain period of time, or may continuously turn on either of the first and the second light sources 61 and 62.

FIGS. 6 to 10 illustrate the example in which the gate line drive circuit 15 individually selects the gate line GCL, but the present disclosure is not limited to this example. The gate line drive circuit 15 may simultaneously select a predetermined number (two or more) of the gate lines GCL, and sequentially supply the gate drive signals Vgcl to the gate lines GCL in units of the predetermined number of the gate lines GCL. The signal line selection circuit 16 may also simultaneously couple a predetermined number (two or more) of the signal lines SGL to one AFE circuit 48. Moreover, the gate line drive circuit 15 may scan some of the gate lines GCL while skipping the others.

If foreign matter and/or external scars cause defects in the sensor structure 22 of the optical sensor PD and, for example, water enters inside, spot-like irregularities (hereinafter, also called "spot irregularities") considered to be caused by charge trapping may be generated. The spot irregularities progress over time and may cause degradation in detection accuracy and imaging characteristics as the detection device 1.

Figure 11A:
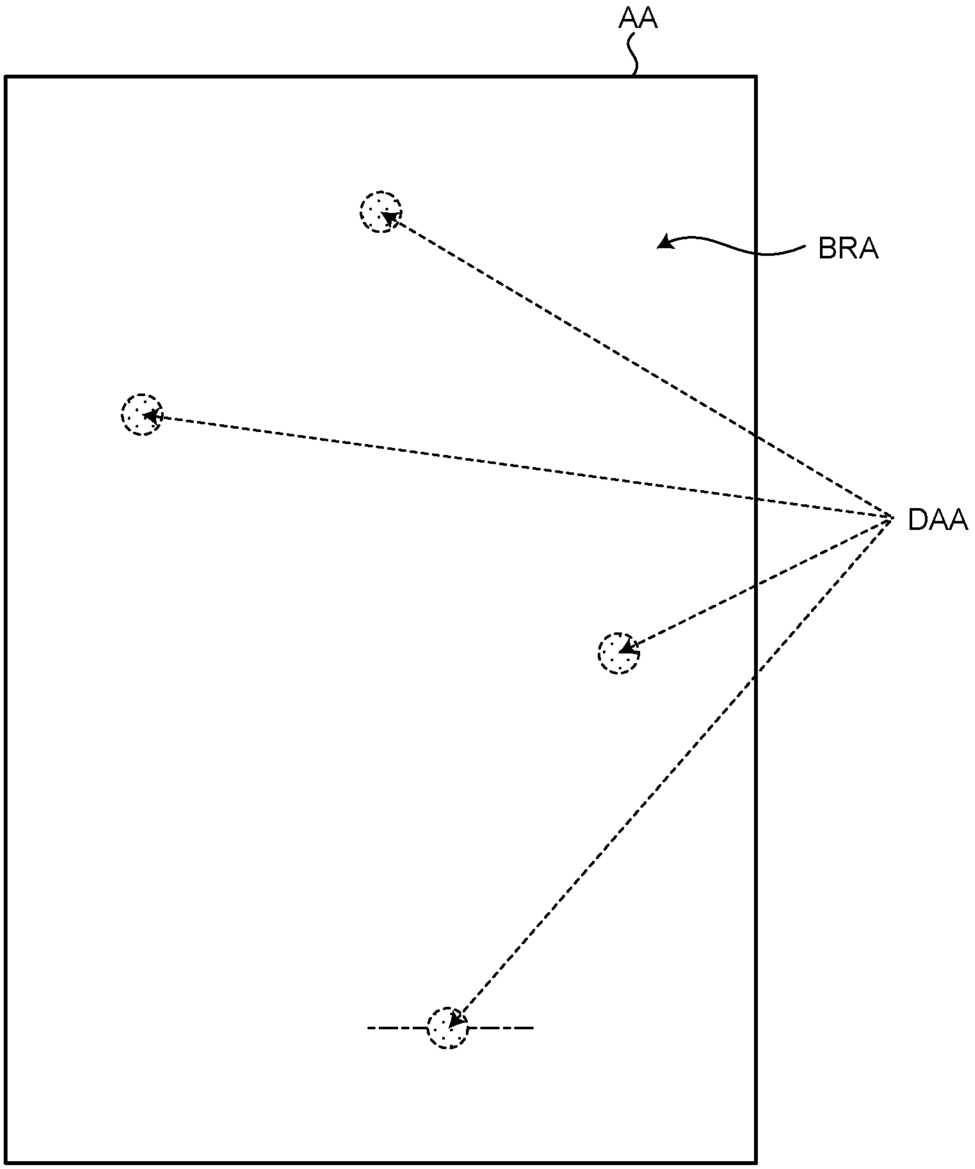
FIG. 11A is a schematic view illustrating an example visualizing a change over time of spot irregularities occurred in a detection area.
Figure 11B:
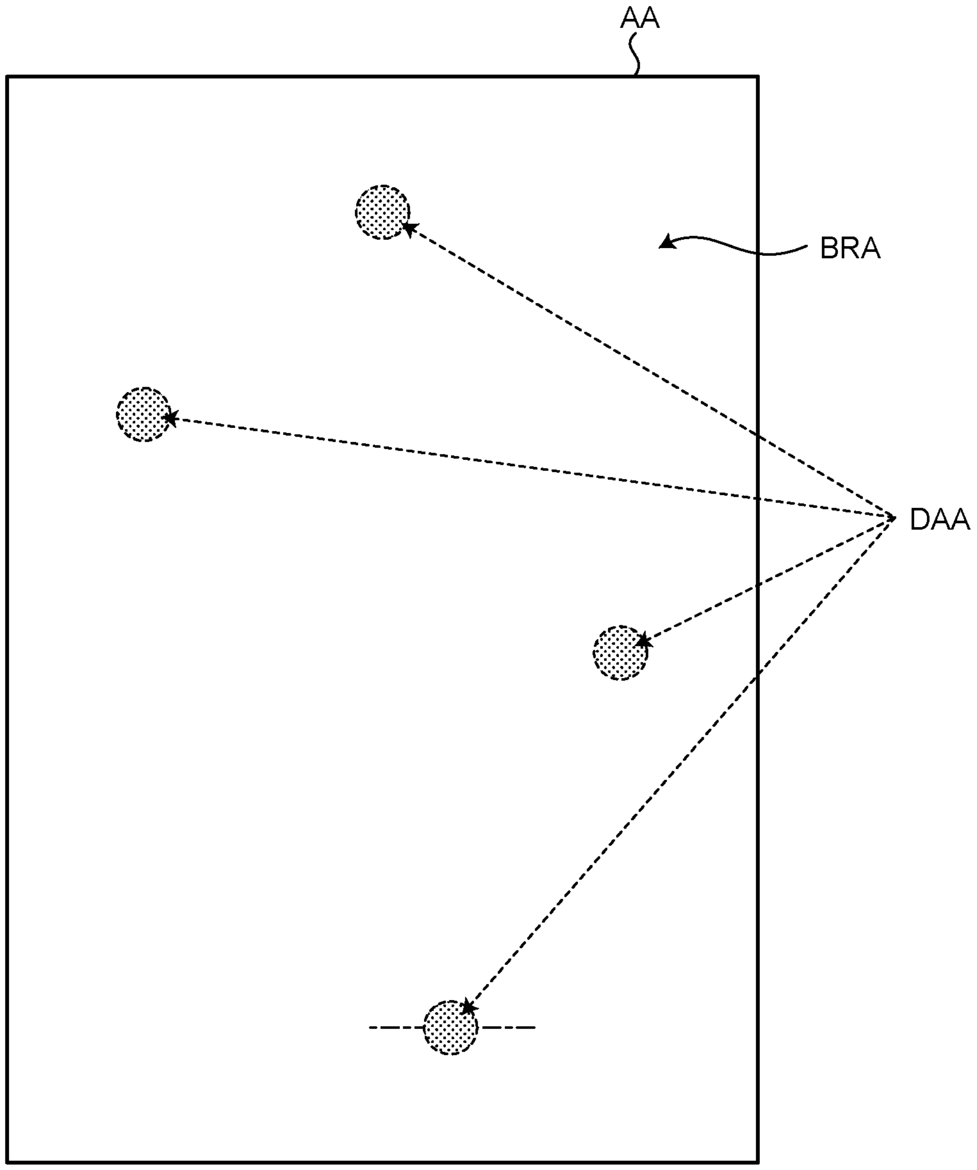
FIG. 11B is a schematic view illustrating the example visualizing the change over time of the spot irregularities occurred in the detection area.
Figure 11C:
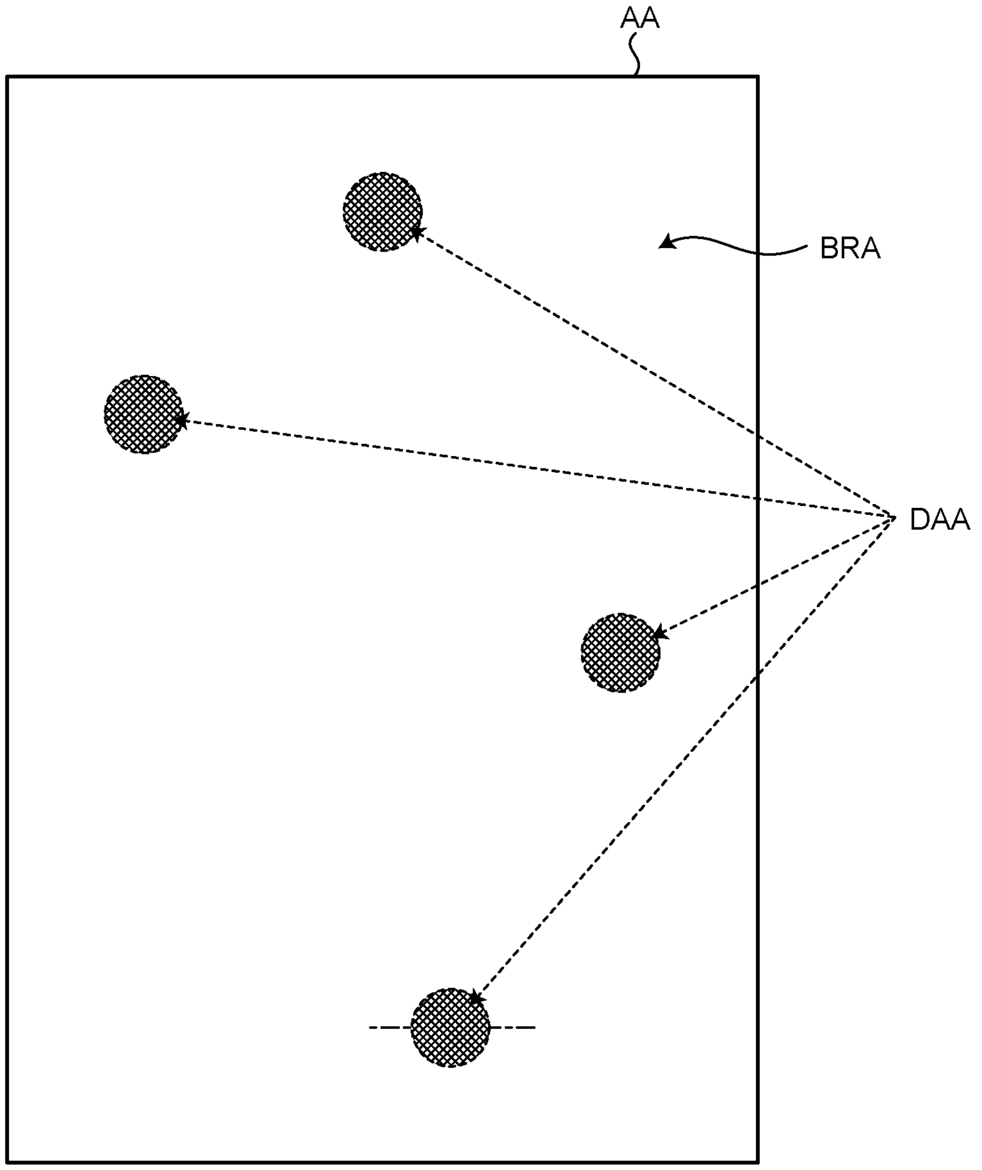
FIG. 11C is a schematic view illustrating the example visualizing the change over time of the spot irregularities occurred in the detection area.
Figure 12A:
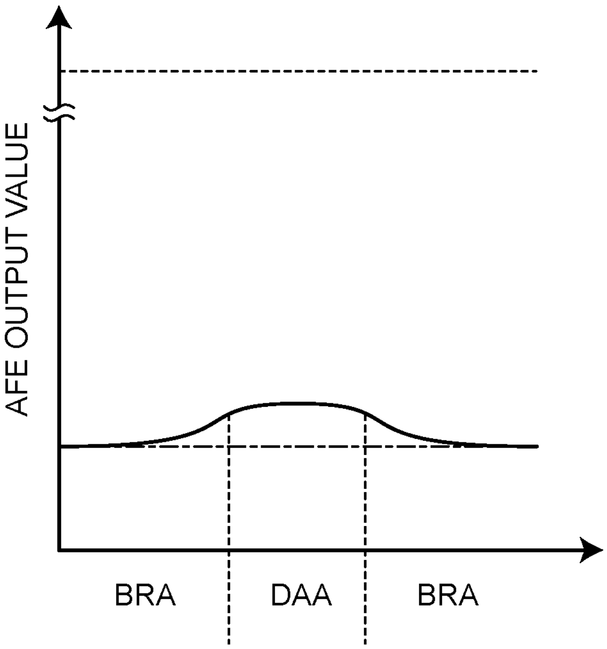
FIG. 12A is an illustrative graph illustrating an example of a change over time of an analog front-end (AFE) output value in an area at or near a location where a spot irregularity has been occurred.

FIGS. 11A, 11B, and 11C are schematic views illustrating an example visualizing the change over time of the spot irregularities occurred in the detection area. FIGS. 12A. 12B, and 12C are illustrative graphs illustrating an example of a change over time of an AFE output value in an area at or near a location where a spot irregularity has been occurred. FIGS. 11A, 11B, 11C, 12A, 12B, and 12C illustrate the examples of the changes over time when the entire detection area AA is irradiated with a constant amount of light (at 1 μW, for example).

Figure 12B:
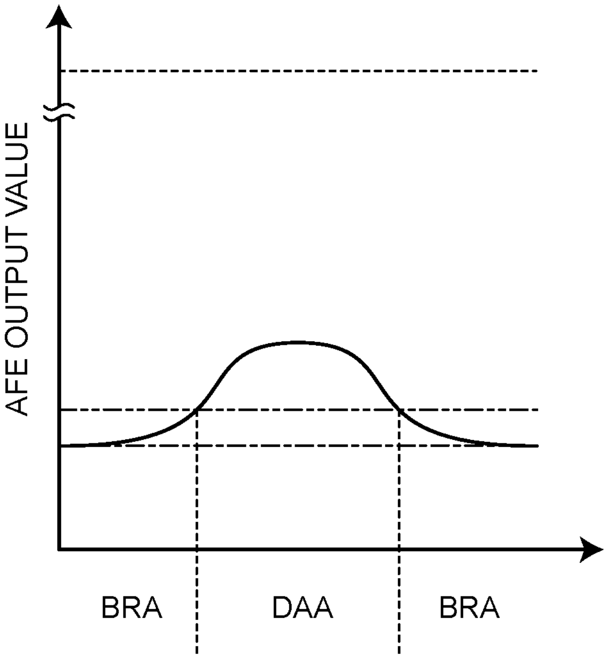
FIG. 12B is an illustrative graph illustrating the example of the change over time of the AFE output value in the area at or near the location where the spot irregularity has been occurred.
Figure 12C:
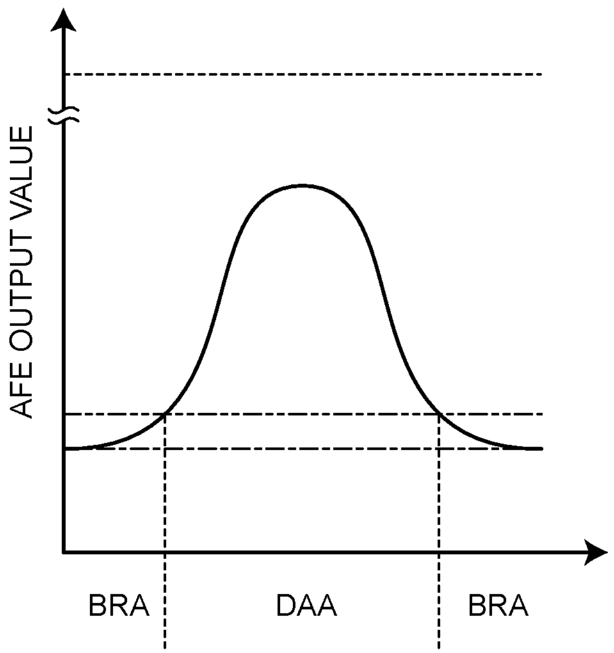
FIG. 12C is an illustrative graph illustrating the example of the change over time of the AFE output value in the area at or near the location where the spotted irregularity has been occurred.

FIGS. 11A, 11B, and 11C illustrate locations where the spot irregularities are occurred in the detection area AA with dashed lines. In FIGS. 12A, 12B, and 12C, the horizontal axis direction indicates the locations of the optical sensors PD arranged on a long dashed short dashed line illustrated in FIGS. 11A, 11B, and 11C. The vertical axis of FIGS. 12A, 12B, and 12C indicates the AFE output value corresponding to the optical sensors PD arranged on the long dashed short dashed line illustrated in FIGS. 11A, 11B, and 11C. The long dashed short dashed line illustrated in FIGS. 12A, 12B, and 12C indicates the AFE output value corresponding to the optical sensor PD at the normal location where no spot irregularity is occurred in the detection area AA, and the dashed line illustrated in FIGS. 12A, 12B, and 12C indicates the AFE output value when the detection area AA is not irradiated with light. An area DAA of each of the spot irregularities indicated by the dashed lines in FIGS. 11A, 11B, and 11C indicates a dark area where the AFE output value exceeds a certain value indicated by a long dashed double-short dashed line in FIGS. 12A, 12B, and 12C. In other words, an area outside the dark area DAA illustrated in FIGS. 12A, 12B, and 12C indicates a normal area BRA where no spot irregularities are occurred.

Even if the spot irregularities are caused by the defects in the optical sensor PD, in an initial state after the detection device 1 is produced, the dark area DAA due to the spot irregularity caused by foreign matter or external scars of the optical sensor PD is small, and the difference in brightness between the dark area DAA and the normal area BRA where no spot irregularities are occurred is also small, as illustrated in FIGS. 11A and 12A. However, over time, the dark area DAA due to the spot irregularity expands and the difference in brightness between the dark area DAA and the normal area BRA also increases, as illustrated in FIGS. 11B and 12B, and FIGS. 11C and 12C. In other words, over time, the AFE output value acquired by the optical sensor PD in the dark area DAA approaches the AFE output value when the detection area AA is not irradiated with light indicated by the dashed line in FIGS. 12A, 12B, and 12C. Therefore, if the spot irregularities are caused by the defects in the optical sensor PD, deterioration occurs over time in the detection accuracy of the biometric information serving as the detection target, specifically, the pulse waves, the pulsation, and the like, and in the imaging characteristics of, for example, the vascular pattern of veins and the like and the fingerprint and the like of the finger Fg in the detection device 1.

Figure 13:
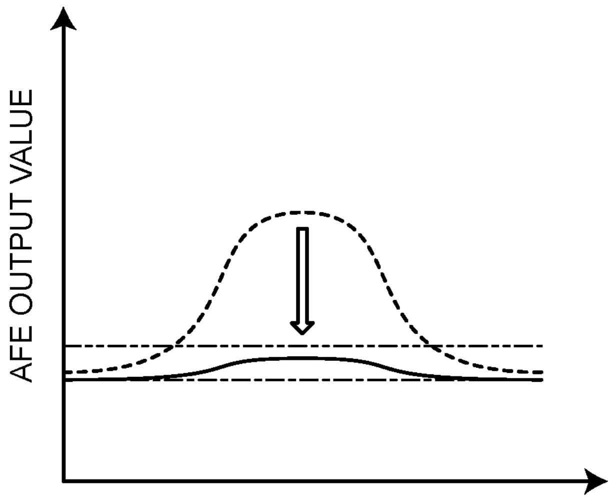
FIG. 13 is an illustrative graph illustrating a change over time of the AFE output value in an area at or near a location where the spot irregularity has been occurred due to a change in sensor power supply potential.

FIG. 13 is an illustrative graph illustrating a change over time of the AFE output value in an area at or near a location where the spot irregularity has been occurred due to a change in sensor power supply potential. A dashed line illustrated in FIG. 13 indicates the AFE output value in the area at or near the location where the spot irregularity has been occurred when the sensor power supply potential VDDSNS is at the normal potential (for example, at 2.75 V). A solid line illustrated in FIG. 13 indicates the AFE output value in the area at or near the location where the spot irregularity has been occurred when the sensor power supply potential VDDSNS is higher than the normal potential (for example, at 3.75 V).

In FIG. 13, the reverse bias voltage applied to the optical sensor PD is increased within a predetermined range (for example, within a range from a normal potential (for example, 2.00 V) to 4.00 V) by increasing the sensor power supply potential VDDSNS within a predetermined range (for example, within a range from the normal potential (for example, 2.75 V) to 4.75 V). This operation can set the AFE output values in the entire detection area AA including the areas at or near the locations where the spot irregularities have been occurred to normal values (within a range between long dashed short dashed lines illustrated in FIG. 13).

In the present disclosure, the sensor power supply potential VDDSNS is increased in accordance with the change over time of the AFE output values corresponding to the optical sensors PD in the entire detection area AA when the entire detection area AA is irradiated with a constant amount of light (at 1 μW, for example), whereby the reverse bias voltage applied to the optical sensors PD in the entire detection area AA is increased. In other words, the sensor power supply potential VDDSNS is controlled so that a second sensor power supply potential VDDSNS2 at a second time after a first time is higher than a first sensor power supply potential VDDSNS1 at the first time. This operation allows the detection device 1 according to the present disclosure to reduce spot irregularities that would be caused by the defects in the optical sensors PD and improve the detection accuracy and the imaging characteristics.

Figure 14:
FIG. 14 is a diagram illustrating a relation between a control circuit and a power supply circuit in the detection device according to the embodiment.

FIG. 14 is a diagram illustrating a relation between the control circuit and the power supply circuit in the detection device according to the embodiment. In the present disclosure, the control circuit 122 generates the sensor power supply control signal VDDSNSCTRL and outputs the generated sensor power supply control signal VDDSNSCTRL to the power supply circuit 123. The sensor power supply control signal VDDSNSCTRL is a signal for controlling the sensor power supply potential to be supplied from the power supply circuit 123 to the optical sensors PD in the entire detection area AA. The following describes an operation for performing a calibration process for the sensor power supply potential according to the present disclosure.

First Embodiment

Figure 15:
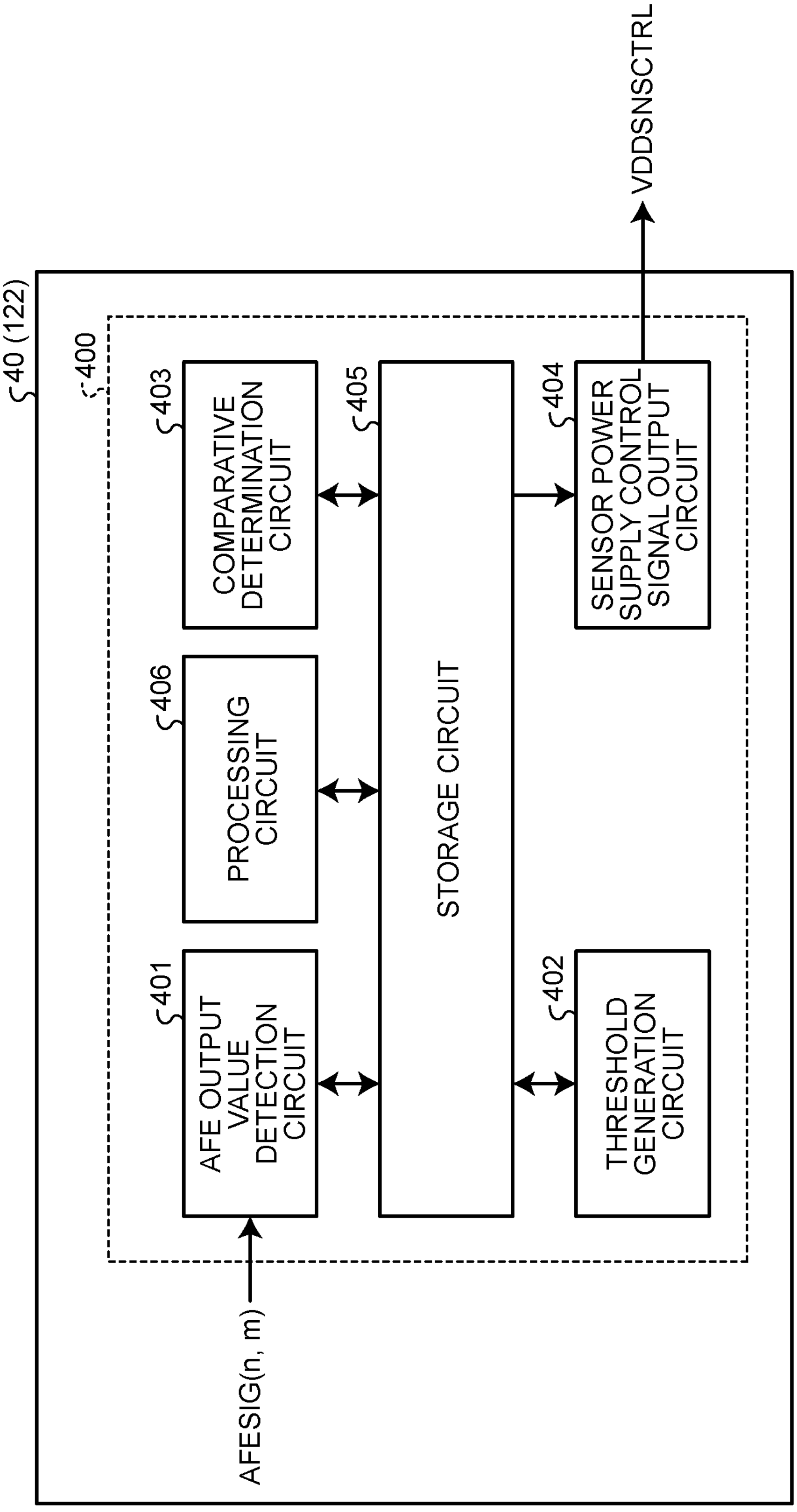
FIG. 15 is a diagram illustrating an exemplary circuit configuration of a sensor power supply control circuit of the detection device according to a first embodiment of the present disclosure.

FIG. 15 is a diagram illustrating an exemplary circuit configuration of a sensor power supply control circuit of the detection device according to a first embodiment of the present disclosure.

As illustrated in FIG. 15, a sensor power supply control circuit 400 according to the first embodiment includes, for example, internal circuitry of the control circuit 122 included in the detection circuit 40. The sensor power supply control circuit 400 includes an AFE output value detection circuit 401, a threshold generation circuit 402, a comparative determination circuit 403, a sensor power supply control signal output circuit 404, a storage circuit 405, and a processing circuit 406.

The functions of the AFE output value detection circuit 401, the threshold generation circuit 402, the comparative determination circuit 403, the sensor power supply control signal output circuit 404, and the processing circuit 406 may be integrated into the signal processing circuit 44, for example. The function of the storage circuit 405 may be integrated into the storage circuit 46, for example.

In the calibration process to be described later, the sensor power supply control circuit 400 outputs, to the power supply circuit 123, the sensor power supply control signal VDDSNSCTRL for changing the sensor power supply potential VDDSNS to be supplied to the optical sensors PD in the entire detection area AA.

Figure 16:
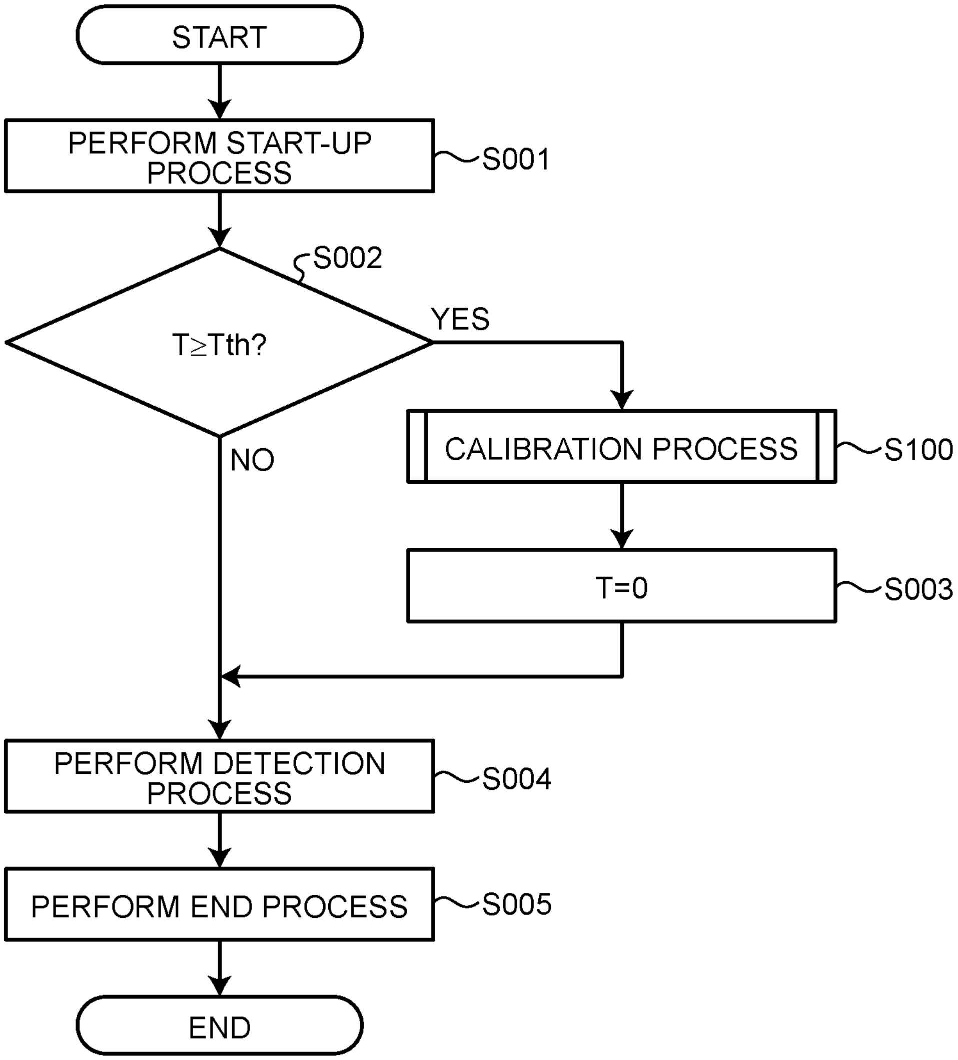
FIG. 16 is a flowchart illustrating an exemplary overall operation of the detection device according to the first embodiment.

FIG. 16 is a flowchart illustrating an exemplary overall operation of the detection device according to the first embodiment. In the present disclosure, the control circuit 122 of the detection device 1 performs a timer process to perform the calibration process for the sensor power supply potential as part of the overall operation illustrated in FIG. 16.

In the first embodiment of the present disclosure, at the time of the first operation (for example, in a testing process in the production line of the detection device 1), the control circuit 122 initially sets a calibration process execution timer T to perform the calibration process for the sensor power supply potential according to the first embodiment. Specifically, the control circuit 122 sets the value of the calibration process execution timer T to "0" (T=0).

After the detection device 1 starts (Step S001), the control circuit 122 determines whether the value of the calibration process execution timer T is equal to or higher than a predetermined calibration process execution time threshold Tth (Step S002). The calibration process execution time threshold Tth is set as appropriate according to the characteristics of the device.

If the value of the calibration process execution timer T is lower than the predetermined calibration process execution time threshold Tth (T<Tth, No at Step S002), the control circuit 122 performs the detection process mentioned above (Step S004), and then performs a predetermined end process (Step S005) to end the overall operation in the detection device 1 illustrated in FIG. 15.

Figure 17:
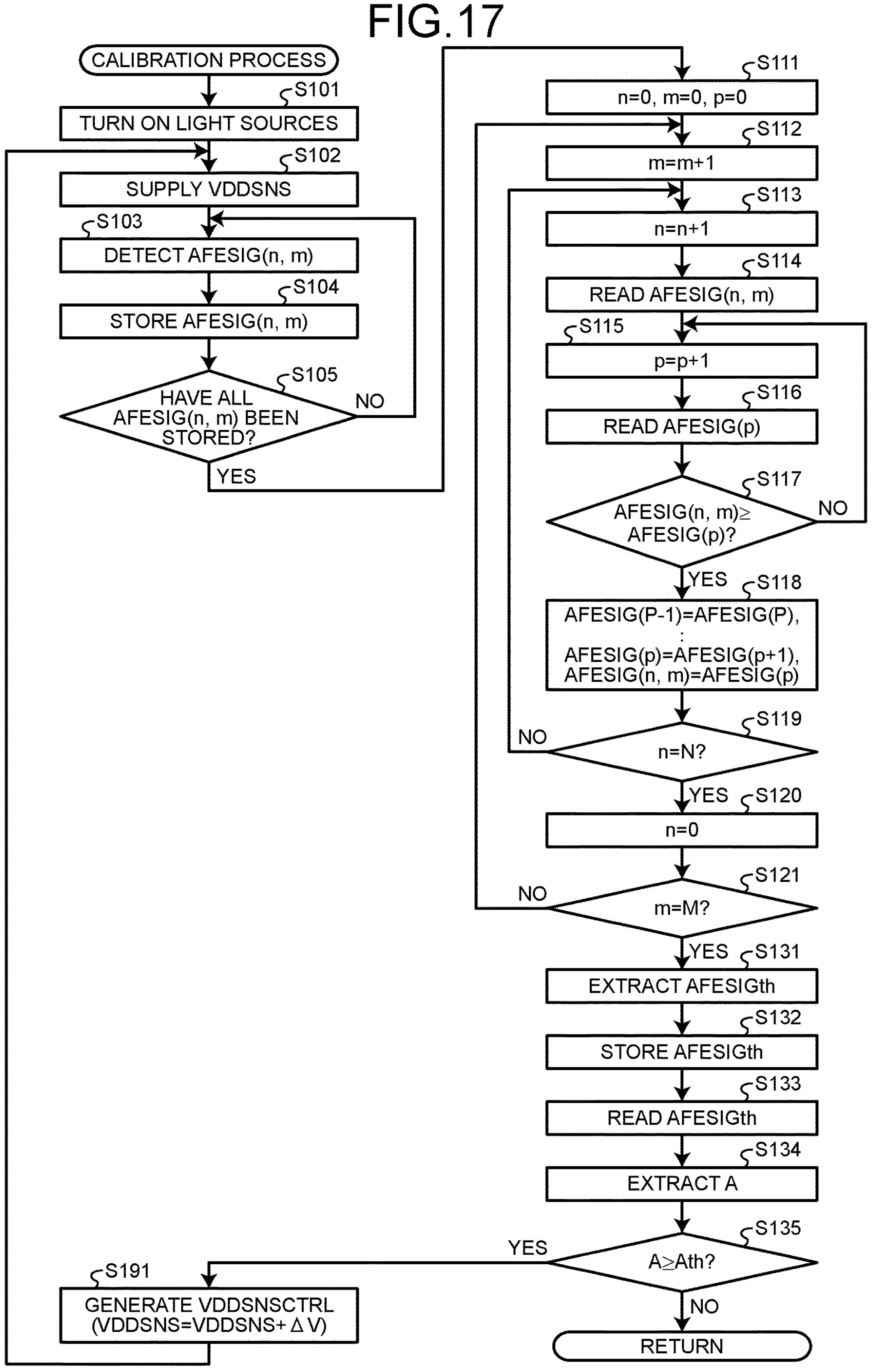
FIG. 17 is a flowchart illustrating an exemplary calibration process for the sensor power supply potential according to the first embodiment.

If the value of the calibration process execution timer T is equal to or higher than the predetermined calibration process execution time threshold Tth (T≥Tth, Yes at Step S002), the control circuit 122 performs the calibration process for the sensor power supply potential VDDSNS according to the first embodiment illustrated in FIG. 17 (corresponding to Step S100 in FIG. 16). FIG. 17 is a flowchart illustrating an exemplary calibration process for the sensor power supply potential according to the first embodiment.

In the calibration process for the sensor power supply potential VDDSNS according to the first embodiment illustrated in FIG. 17, the control circuit 122 performs a detection operation for calibration. Specifically, the control circuit 122 turns on the first light sources 61 or the second light sources 62 at a predetermined amount of light (at 1 μW, for example) (Step S101), and the power supply circuit 123 supplies the sensor power supply potential VDDSNS based on the sensor power supply control signal VDDSNSCTRL output from the control circuit 122 to the optical sensors PD in the entire detection area AA (Step S102).

The AFE output value detection circuit 401 detects an AFE output value AFESIG(n, m) (n is a natural number from 1 to N, and m is a natural number from 1 to M, refer to FIG. 4) output from the AFE circuit 48 (Step S103), and sequentially stores the AFE output value AFESIG(n, m) in the storage circuit 405 (Step S104).

The AFE output value detection circuit 401 determines whether all the AFE output values AFESIG(n, m) corresponding to the optical sensors PD in the entire detection area AA have been stored (Step S105). If all the AFE output values AFESIG(n, m) corresponding to the optical sensors PD in the entire detection area AA have not been stored (No at Step S105), the process from Step S103 to Step S104 is repeated until all the AFE output values AFESIG(n, m) corresponding to the optical sensors PD in the entire detection area AA are stored (Yes at Step S105).

If all the AFE output values AFESIG(n, m) corresponding to the optical sensors PD in the entire detection area AA have been stored (Yes at Step S105), AFE output value information illustrated in FIG. 18 is generated. FIG. 18 is a table illustrating an example of the AFE output value information. The AFE output value information illustrated in FIG. 18 is stored in a storage area of the storage circuit 405 (storage circuit 46).

After the AFE output value information illustrated in FIG. 18 is generated by the process from Step S101 to Step S105, the sensor power supply control circuit 400 performs a descending order sort process for all the acquired AFE output values AFESIG(n, m) corresponding to the optical sensors PD in the entire detection area AA (Steps S111 to S121), and generates AFE output value descending order sort information illustrated in FIG. 19. FIG. 19 is a table illustrating an example of the AFE output value descending order sort information that serves as a base of the calibration process for the sensor power supply potential according to the first embodiment. In FIG. 19, "AFESIG(p)" denotes the AFE output value corresponding to a rank p in descending order.

The AFE output value descending order sort information illustrated in FIG. 19 stores a "null value" as the initial value of the AFE output value at each rank. By performing the descending order sort process described below, the AFE output value descending order sort information is generated in which all the AFE output values AFESIG(n, m) corresponding to the optical sensor PDs in the entire detection area AA are arranged in descending order.

Specifically, the processing circuit 406 sets that: n=0, m=0, and p=0 (where p is a natural number from 1 to N×M (=P)) (Step S111); m=m+1 (Step S112); and n=n+1 (Step S113). The processing circuit 406 reads the AFE output signal level AFESIG(n, m) from the storage circuit 405 (Step S114).

The processing circuit 406 sets that p=p+1 (Step S115), reads the AFE output value AFESIG(p) corresponding to the rank p (Step S116), and determines whether the AFE output value AFESIG(n, m) is equal to or higher than the AFE output value AFESIG(p) (AFESIG(n, m)≥AFESIG(p), Step S117).

If the AFE output value AFESIG(n, m) is lower than the AFE output value AFESIG(p) (AFESIG(n, m)<AFESIG(p), No at Step S117), the process from Step S115 to Step S117 is repeated.

If the AFE output value AFESIG(n, m) is equal to or higher than the AFE output value AFESIG(p) (AFESIG(n, m) AFESIG(p), Yes at Step S117), the processing circuit 406 increments the AFE output value AFESIG(p) at the current rank p and higher ranks (AFESIG(P−1)=AFESIG(P), . . . , AFESIG(p)=AFESIG(p+1)) and stores the AFE output value AFESIG(n, m) as the AFE output value AFESIG(p) at the rank p (Step S118).

The processing circuit 406 then determines whether n=N (Step S119). If n=N is not established (No at Step S119), the processing circuit 406 repeats the process from Step S113 to Step S119. If n=N (Yes at Step S119), the processing circuit 406 sets that n=0 (Step S120) and determines whether m=M (Step S121). If m=M is not established (No at Step S121), the processing circuit 406 repeats the process from Step S112 to Step S121.

The descending order sort process described above (Steps S111 to S121) generates the AFE output value descending order sort information illustrated in FIG. 19. The AFE output values AFESIG(q), AFESIG(q+1), . . . , AFESIG(q+r) illustrated in FIG. 19 are the same value.

Figure 20:
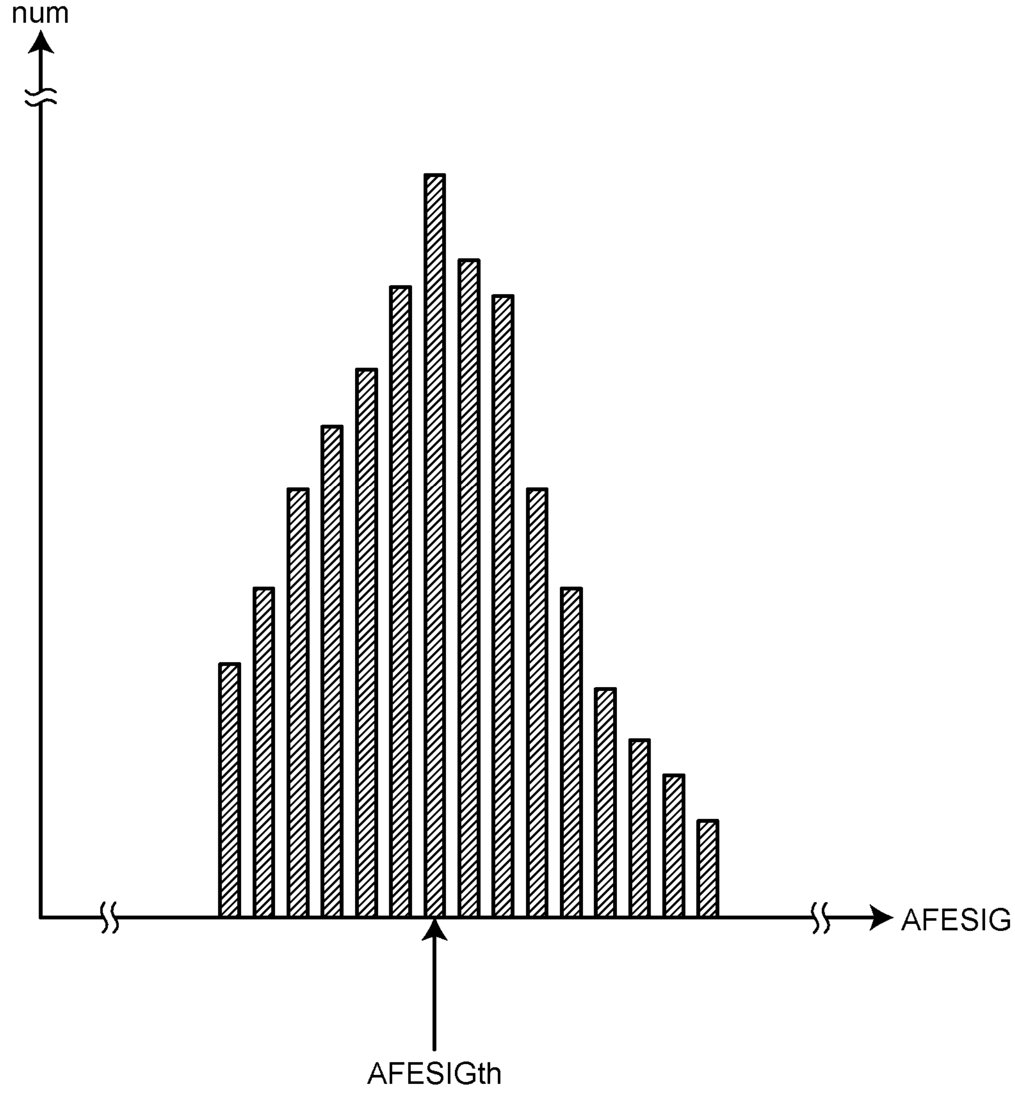
FIG. 20 is a histogram illustrating an exemplary distribution of the AFE output values according to the first embodiment.

If m=M (Yes at Step S121), the threshold generation circuit 402 reads the AFE output value descending order sort information stored in the storage circuit 405 and extracts a threshold AFESIGth for the AFE output value AFESIG(p) (Step S131). A specific example of the threshold AFESIGth will be described with reference to FIGS. 19 and 20. FIG. 20 is a histogram illustrating an exemplary distribution of the AFE output values according to the first embodiment. The histogram illustrated in FIG. 20 can be derived from the AFE output value descending order sort information illustrated in FIG. 19.

In the present disclosure, the AFE output value AFESIG (p) with the largest number of the AFE output values AFESIG(p) having the same value is set as the threshold AFESIGth, as illustrated in FIG. 20. FIG. 19 illustrates the example in which the AFE output values AFESIG(q), AFESIG(q+1), . . . , AFESIG(q+r) having the same value are set as the threshold AFESIGth (AFESIG(q)=AFESIG (q+1)= . . . , =AFESIG(q+r)=AFESIGth). The method for deriving the threshold AFESIGth illustrated herein is an example, and the present disclosure is not limited by the method for deriving the threshold AFESIGth.

The threshold generation circuit 402 stores the extracted threshold AFESIGth in the storage circuit 405 (Step S132).

The comparative determination circuit 403 reads the threshold AFESIGth stored in the storage circuit 405 (Step S133), extracts the number A of the AFE output values AFESIG(p) that are equal to or higher than the threshold AFESIGth (Step S134, refer to FIG. 19), and determines whether the number A of the AFE output values AFESIG(p) that are equal to or higher than the threshold AFESIGth is equal to or larger than a predetermined number Ath (Step S135). The predetermined number Ath that is a threshold for the number A of the AFE output values AFESIG(p) that are equal to or higher than the threshold AFESIGth is set to 10 (Ath=10), for example. The predetermined number Ath=10 illustrated herein is an example, and the present disclosure is not limited by the predetermined number Ath.

If the number A of the AFE output values AFESIG(p) that are equal to or higher than the threshold AFESIGth is smaller than the predetermined number Ath (A<Ath, No at Step S135), the process returns to the overall operation of the detection device 1 illustrated in FIG. 16, sets the value of the calibration process execution timer T to "0" (T=0) (Step S003), and moves to the subsequent detection process (Step S004).

If the number A of the AFE output values AFESIG(p) that are equal to or higher than the threshold AFESIGth is equal to or larger than the predetermined number Ath (A Ath, Yes at Step S135), the sensor power supply control signal output circuit 404 generates the sensor power supply control signal VDDSNSCTRL to cause the power supply circuit 123 to increase the sensor power supply potential VDDSNS by ΔV (Step S191) and outputs the sensor power supply control signal VDDSNSCTRL to the power supply circuit 123, and the process starting from Step S102 is repeated.

If the number A of the AFE output values AFESIG(p) that are equal to or higher than the threshold AFESIGth is smaller than the predetermined number Ath (A<Ath, No at Step S135), the process returns to the overall operation of the detection device 1 illustrated in FIG. 16, sets the value of the calibration process execution timer T to "0" (T=0) (Step S003), and moves to the subsequent detection process (Step S004). The value of ΔV serving as an increment of the sensor power supply potential VDDSNS is set to 0.1 V (ΔV=0.1 V), for example. The value of the increment ΔV (=0.1 V) of the sensor power supply potential VDDSNS illustrated herein is an example, and the present disclosure is not limited by the value of the increment ΔV of the sensor power supply potential VDDSNS.

Figure 21:
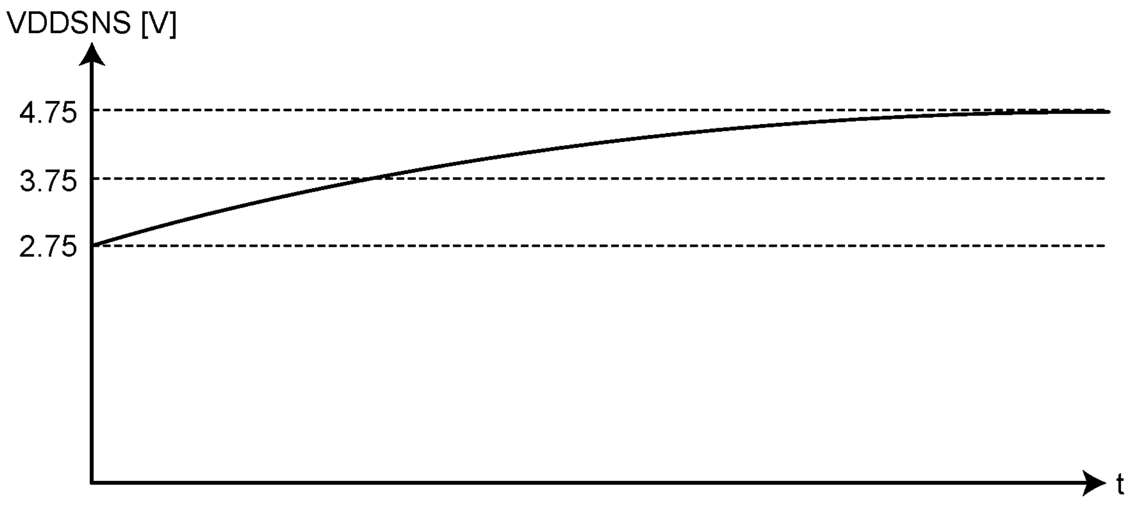
FIG. 21 is a graph illustrating an exemplary change over time of the sensor power supply potential in the detection device according to the first embodiment.

The detection device 1 according to the first embodiment performs the calibration process described above each time a predetermined time (calibration process execution time) elapses. This operation increases the sensor power supply potential VDDSNS with the passage of time t, as illustrated in FIG. 21. FIG. 21 is a graph illustrating an example of the change over time of the sensor power supply potential in the detection device according to the first embodiment.

According to the first embodiment described above, the calibration process for the sensor power supply potential VDDSNS according to the first embodiment is performed each time a predetermined time (calibration process execution time threshold Tth) or more elapses. Specifically, in the calibration process for the sensor power supply potential VDDSNS according to the first embodiment, the sensor power supply potential VDDSNS is increased when, among all the AFE output values AFESIG(n, m) corresponding to the optical sensors PD in the entire detection area AA, the number A of the AFE output values AFESIG(p) that are equal to or higher than the threshold AFESIGth is equal to or larger than the predetermined number Ath.

This operation allows the sensor power supply potential VDDSNS to increase in accordance with the change over time of the AFE output values corresponding to the optical sensors PD in the entire detection area AA when the entire detection area AA is irradiated with a constant amount of light (at 1 μW, for example). As a result, the reverse bias voltage applied to the optical sensors PD in the entire detection area AA can be increased. Thus, the spot irregularities that would be caused by the defects in the optical sensors PD can be reduced, and the detection accuracy and the imaging characteristics can be improved.

Second Embodiment

Figure 22:
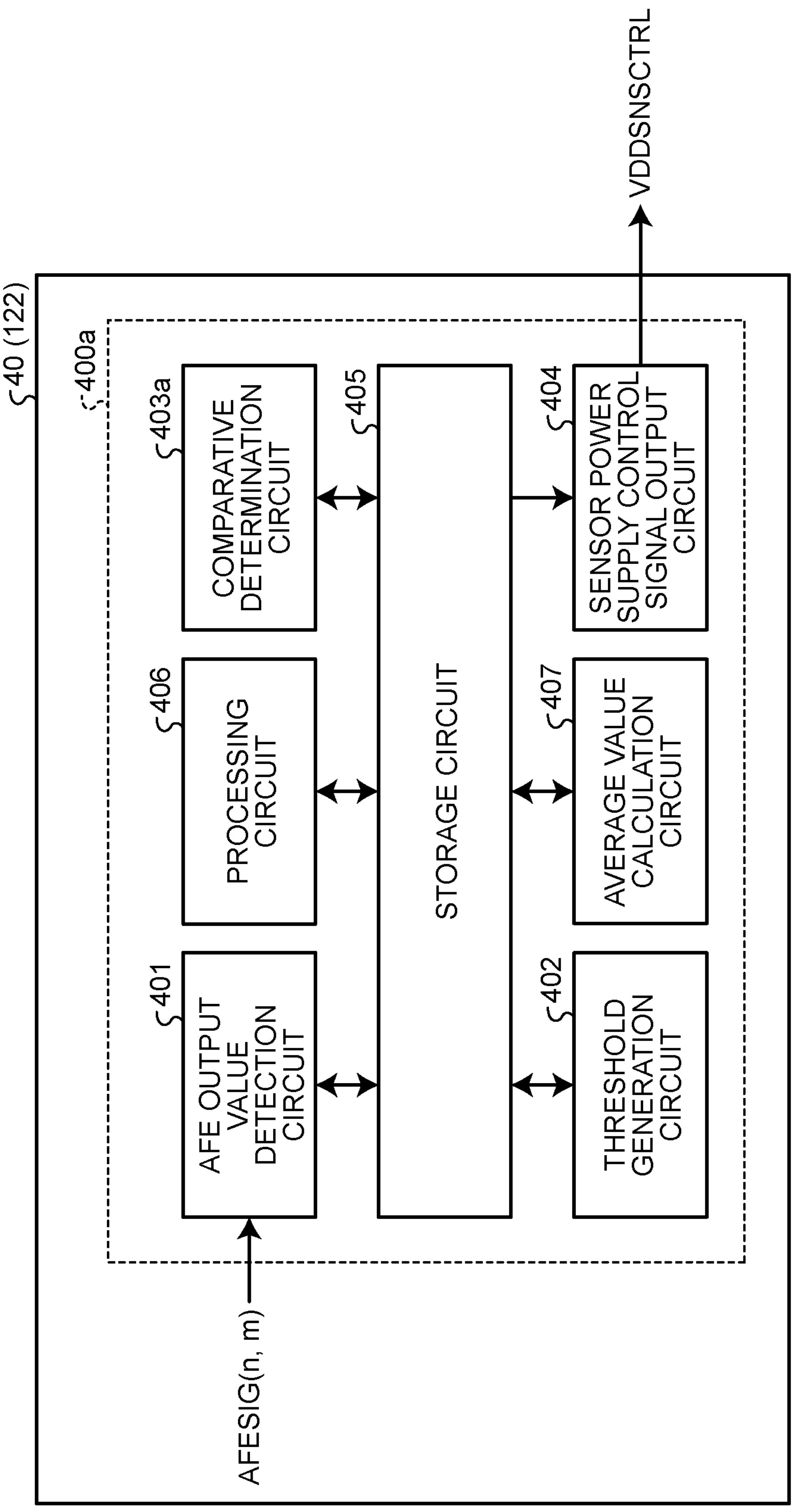
FIG. 22 is a diagram illustrating an exemplary circuit configuration of a sensor power supply control circuit of the detection device according to a second embodiment of the present disclosure.
Figure 23:
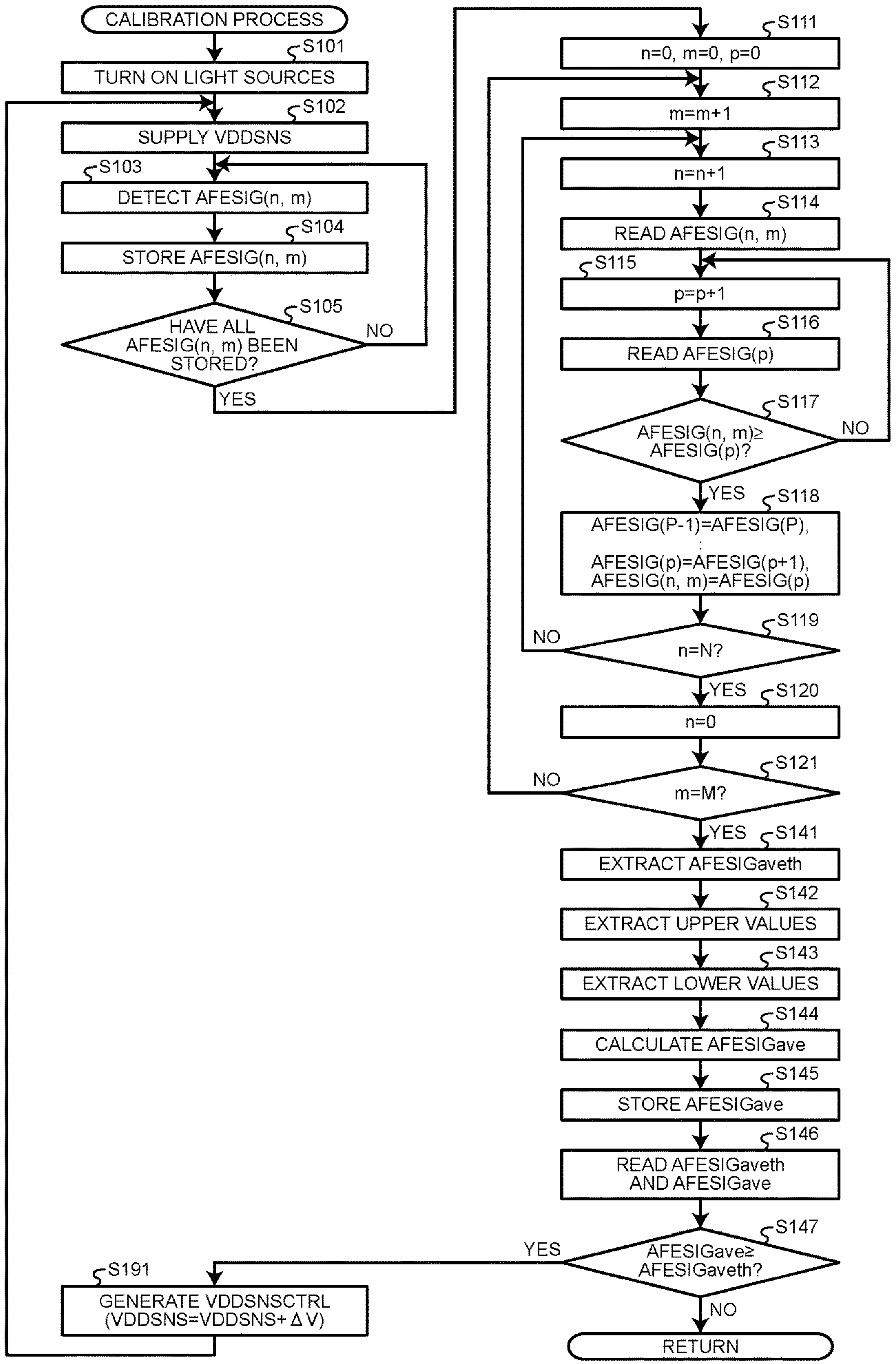
FIG. 23 is a flowchart illustrating an exemplary calibration process for the sensor power supply potential according to the second embodiment.
Figure 25:
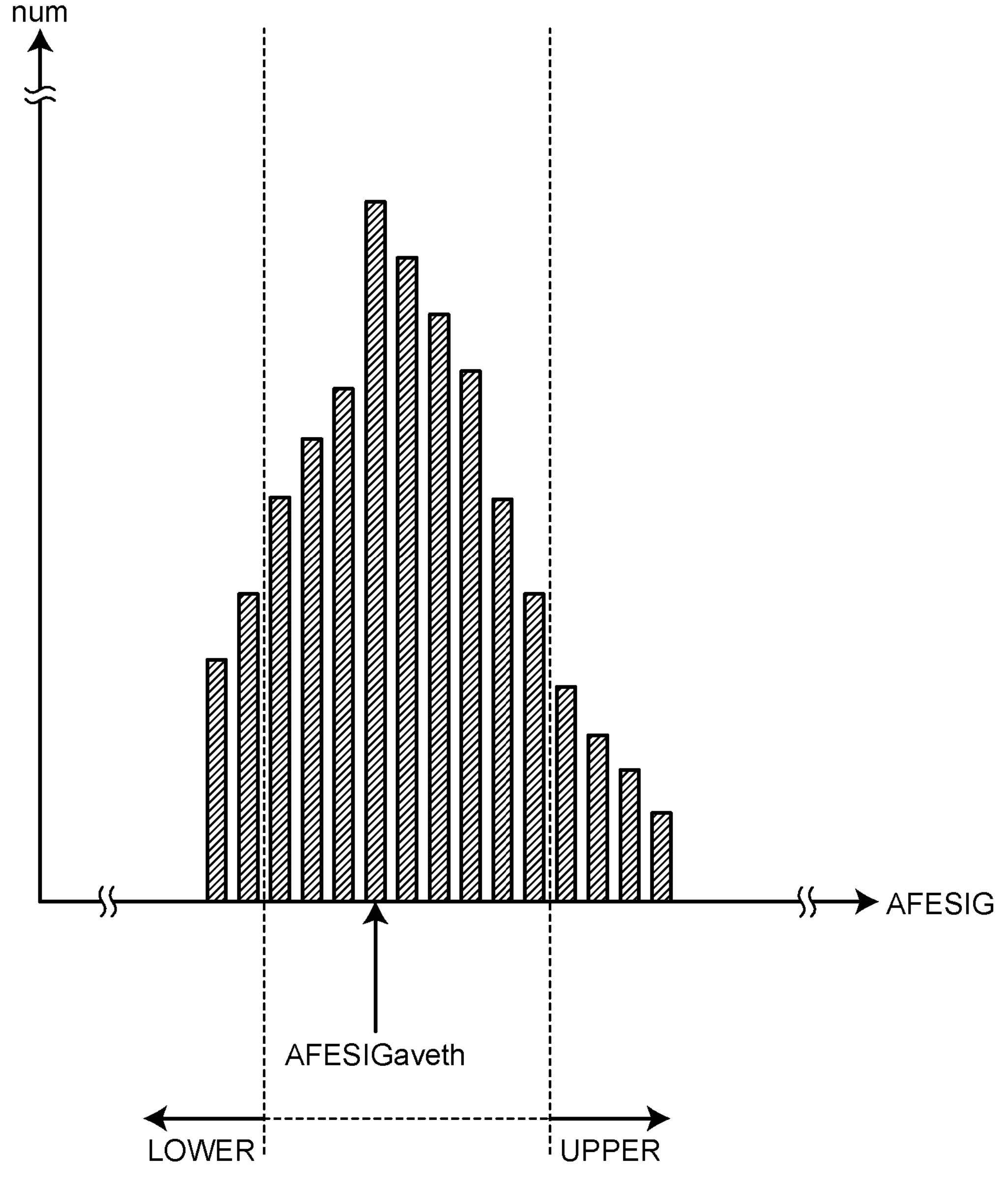
FIG. 25 is a histogram illustrating an exemplary distribution of the AFE output values according to the second embodiment.

FIG. 22 is a diagram illustrating an exemplary circuit configuration of a sensor power supply control circuit of the detection device according to a second embodiment of the present disclosure. FIG. 23 is a flowchart illustrating an exemplary calibration process for the sensor power supply potential according to the second embodiment. FIG. 24 is a table illustrating an example of the AFE output value descending order sort information that serves as the base of the calibration process for the sensor power supply potential according to the second embodiment. FIG. 25 is a histogram illustrating an exemplary distribution of the AFE output values according to the second embodiment. The overall operation, the AFE output value information, and the change over time of the sensor power supply potential in the detection device 1 according to the second embodiment are the same as those of the first embodiment, and therefore, will not be described in detail. Duplicate description may also be omitted for portions of the circuit configuration of the sensor power supply control circuit of the detection device and portions of the calibration process for the sensor power supply potential VDDSNS according to the second embodiment that are the same as those according to the first embodiment.

As illustrated in FIG. 22, a sensor power supply control circuit 400*a* according to the second embodiment includes an average value calculation circuit 407 in addition to the components of the sensor power supply control circuit 400 according to the first embodiment. The function of the average value calculation circuit 407 may be integrated into, for example, the signal processing circuit 44, in the same manner as the functions of the AFE output value detection circuit 401, the threshold generation circuit 402, a comparative determination circuit 403*a*, the sensor power supply control signal output circuit 404, and the processing circuit 406.

In the calibration process for the sensor power supply potential VDDSNS according to the second embodiment illustrated in FIG. 23, the descending order sort process (Steps S111 to S121) generates the AFE output value descending order sort information illustrated in FIG. 24, and then, the threshold generation circuit 402 reads the AFE output value descending order sort information stored in the storage circuit 405, and extracts a threshold AFESIGaveth for an average value AFESIGave to be described later (Step S141, refer to FIGS. 24 and 25). The method for extracting the threshold AFESIGaveth is the same as that for the threshold AFESIGth of the first embodiment.

The average value calculation circuit 407 extracts a predetermined number of upper values of the AFE output values AFESIG(p) with reference to the AFE output value descending order sort information (Step S142). The average value calculation circuit 407 extracts a predetermined number of lower values of the AFE output values AFESIG(p) with reference to the AFE output value descending order sort information (Step S143). The predetermined numbers of the upper and lower values of the AFE output values AFESIG(p) to be extracted are each 10, for example. FIG. 24 illustrates an example of extracting the AFE output values AFESIG(1) to AFESIG(10) from the rank 1 to the rank 10 in descending order as the upper values, and extracting the AFE output values AFESIG(P) to AFESIG(P−9) from the rank P to the rank P−9 in ascending order as the lower values. However, the predetermined number "10" illustrated herein by which each group of the upper and lower values of the AFE output values AFESIG(p) is extracted is an example, and the present disclosure is not limited by the predetermined number by which each group of the upper and lower values of the AFE output values AFESIG(p) is extracted.

The average value calculation circuit 407 calculates the average value AFESIGave of the AFE output values AFESIG(1) to AFESIG(10) from the rank 1 to the rank 10 extracted in descending order and the AFE output values AFESIG(P) to AFESIG(P−9) from the rank P to the rank P−9 extracted in ascending order (Step S144).

The average value calculation circuit 407 stores the calculated average value AFESIGave in the storage circuit 405 (Step S145).

The comparative determination circuit 403*a* reads the threshold AFESIGaveth and the average value AFESIGave that are stored in the storage circuit 405 (Step S146), and determines whether the average value AFESIGave is equal to or higher than the threshold AFESIGaveth (Step S147).

If the average value AFESIGave is lower than the threshold AFESIGaveth (AFESIGave<AFESIGaveth, No at Step S147), the process returns to the overall operation of the detection device 1 illustrated in FIG. 16, sets the value of the calibration process execution timer T to "0" (T=0) (Step S003), and moves to the subsequent detection process (Step S004).

If the average value AFESIGave is equal to or higher than the threshold AFESIGaveth (AFESIGave≥AFESIGaveth, Yes at Step S147), the sensor power supply control signal output circuit 404 generates the sensor power supply control signal VDDSNSCTRL to cause the power supply circuit 123 to increase the sensor power supply potential VDDSNS by ΔV (Step S191), and outputs the sensor power supply control signal VDDSNSCTRL to the power supply circuit 123, and the process starting from Step S102 is repeated.

If the average value AFESIGave is lower than the threshold AFESIGaveth (AFESIGave<AFESIGaveth, No at Step S147), the process returns to the overall operation of the detection device 1 illustrated in FIG. 16, sets the value of the calibration process execution timer T to "0" (T=0) (Step S003), and moves to the subsequent detection process (Step S004). The value of ΔV serving as the increment of the sensor power supply potential VDDSNS is set to 0.1 V (ΔV=0.1 V), for example. The value of the increment ΔV (=0.1 V) of the sensor power supply potential VDDSNS illustrated herein is an example, and the present disclosure is not limited by the value of the increment ΔV of the sensor power supply potential VDDSNS.

According to the second embodiment described above, the calibration process for the sensor power supply potential VDDSNS according to the second embodiment is performed each time the predetermined time (calibration process execution time threshold Tth) or more elapses. Specifically, in the calibration process for the sensor power supply potential VDDSNS according to the second embodiment, the sensor power supply potential VDDSNS is increased if, among all the AFE output values AFESIG(n, m) corresponding to the optical sensors PD in the entire detection area AA, the average value AFESIGave of the predetermined number of the upper AFE output values AFESIG(p) and the predetermined number of the lower AFE output values AFESIG (p) is equal to or higher than the threshold AFESIGaveth.

This operation allows the sensor power supply potential VDDSNS to increase in accordance with the change over time of the AFE output values corresponding to the optical sensors PD in the entire detection area AA when the entire detection area AA is irradiated with a constant amount of light (at 1 μW, for example), in the same manner as in the first embodiment. As a result, the reverse bias voltage applied to the optical sensors PD in the entire detection area AA can be increased. Thus, the spot irregularities that would be caused by the defects in the optical sensors PD can be reduced, and the detection accuracy and the imaging characteristics can be improved, in the same manner as in the first embodiment.

Third Embodiment

Figure 26:
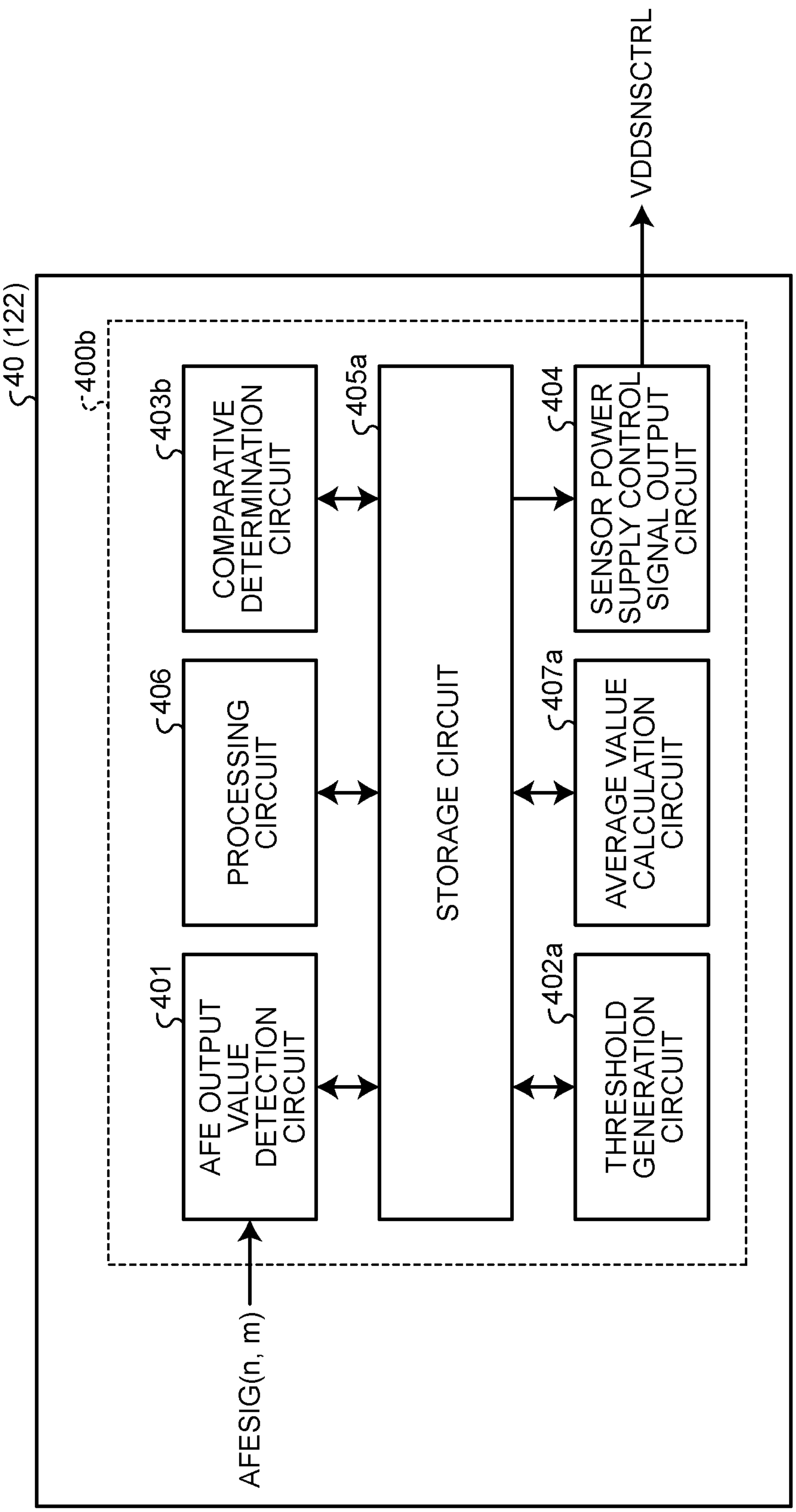
FIG. 26 is a diagram illustrating an exemplary circuit configuration of a sensor power supply control circuit of the detection device according to a third embodiment of the present disclosure.
Figure 27:
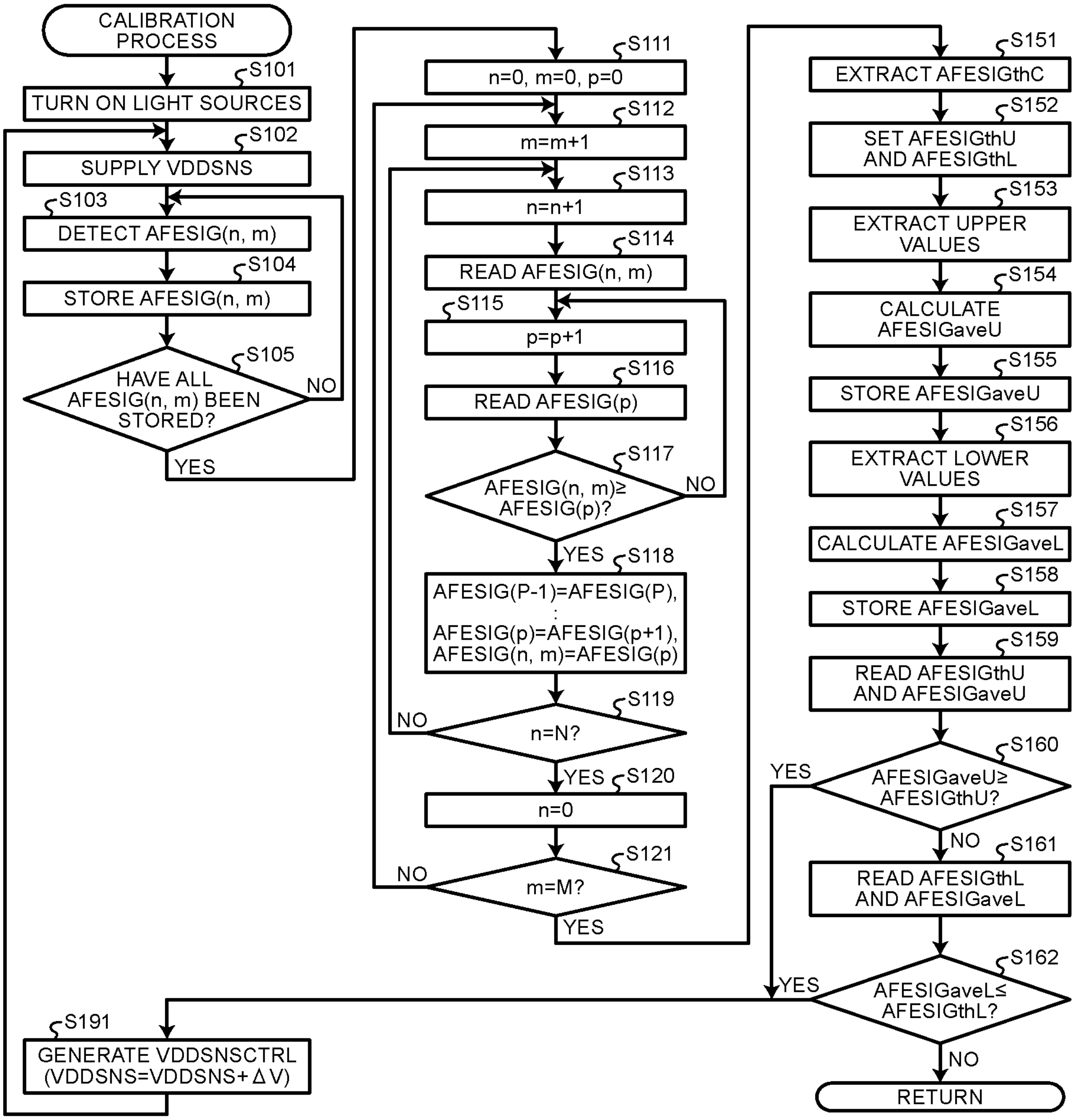
FIG. 27 is a flowchart illustrating an exemplary calibration process for the sensor power supply potential according to the third embodiment.
Figure 29:
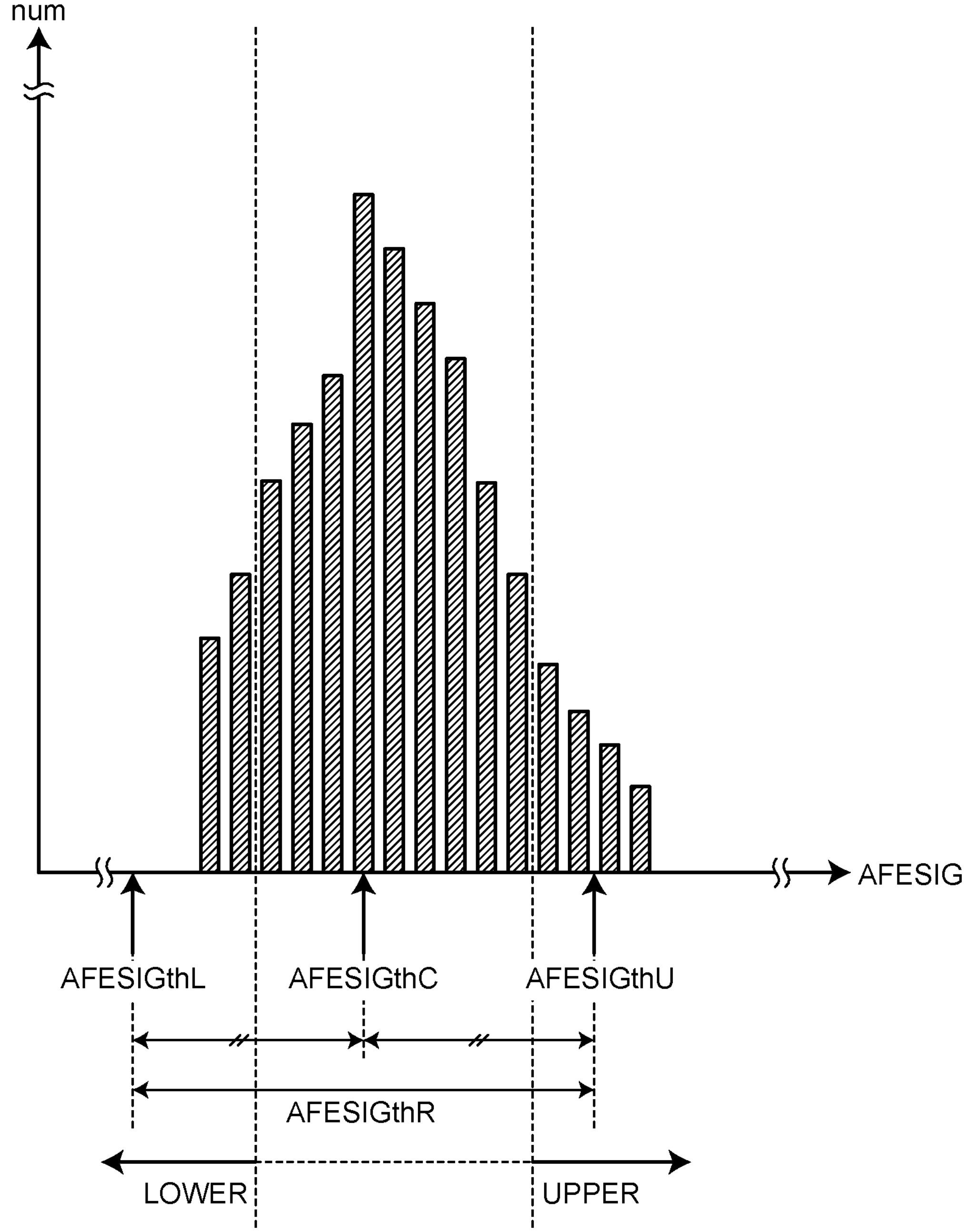
FIG. 29 is a histogram illustrating an exemplary distribution of the AFE output values according to the third embodiment.

FIG. 26 is a diagram illustrating an exemplary circuit configuration of a sensor power supply control circuit of the detection device according to a third embodiment of the present disclosure. FIG. 27 is a flowchart illustrating an exemplary calibration process for the sensor power supply potential according to the third embodiment. FIG. 28 is a table illustrating an example of the AFE output value descending order sort information that serves as the base of the calibration process for the sensor power supply potential according to the third embodiment. FIG. 29 is a histogram illustrating an exemplary distribution of the AFE output values according to the third embodiment. The overall operation, the AFE output value information, and the change over time of the sensor power supply potential in the detection device 1 according to the third embodiment are the same as those of the first and the second embodiments, and therefore, will not be described in detail. Duplicate description may also be omitted for portions of the circuit configuration of the sensor power supply control circuit of the detection device and portions the calibration process for the sensor power supply potential VDDSNS according to the third embodiment that are the same as those according to the first or the second embodiment.

A storage circuit 405*a* of a sensor power supply control circuit 400*b* according to the third embodiment illustrated in FIG. 26 has stored therein in advance a threshold range AFESIGthR of an upper average value AFESIGaveU and a lower average value AFESIGaveL, which are to be described later. The threshold range AFESIGthR is set as appropriate according to the characteristics of the device.

In the calibration process for the sensor power supply potential VDDSNS according to the third embodiment illustrated in FIG. 27, the descending order sort process described above (Steps S111 to S121) generates the AFE output value descending order sort information illustrated in FIG. 28. A threshold generation circuit 402*a* then reads the AFE output value descending order sort information stored in the storage circuit 405, and extracts a median AFESIGthC of an upper threshold AFESIGthU (first threshold) for the upper average value AFESIGaveU and a lower threshold AFESIGthL (second threshold) for the lower average value AFESIGaveL (Step S151, refer to FIGS. 28 and 29). The method for extracting the median AFESIGthC is the same as that for the threshold AFESIGth of the first embodiment.

The threshold generation circuit 402*a* then sets the upper threshold AFESIGthU (first threshold) for the upper average value AFESIGaveU and the lower threshold AFESIGthL (second threshold) for the lower average value AFESIGaveL (Step S152, refer to FIG. 29). Specifically, the threshold generation circuit 402*a* calculates the upper threshold AFESIGthU, for example, by adding a half value of the threshold range AFESIGthR to the median AFESIGthC extracted at Step S151. The threshold generation circuit 402*a* calculates the lower threshold AFESIGthL, for example, by subtracting the half value of the threshold range AFESIGthR from the median AFESIGthC extracted at Step S151.

The threshold generation circuit 402*a* sets the calculated upper threshold AFESIGthU as the threshold (first threshold) for the upper average value AFESIGaveU and sets the calculated lower threshold AFESIGthL as the threshold (second threshold) for the lower average value AFESIGaveL. The method for setting the upper and the lower thresholds AFESIGthU and AFESIGthL illustrated herein is an example, and the present disclosure is not limited by the method for setting the upper and the lower thresholds AFESIGthU and AFESIGthL.

An average value calculation circuit 407*a* extracts a predetermined number of upper values of the AFE output values AFESIG(p) with reference to the AFE output value descending order sort information (Step S153). The predetermined number of the upper values to be extracted from the AFE output values AFESIG(p) is set to 10, for example. In this case, the average value calculation circuit 407*a* calculates the upper average value AFESIGaveU of the AFE output values AFESIG(1) to AFESIG(10) from the rank 1 to the rank 10 extracted in descending order (Step S154), and stores the upper average value AFESIGaveU in the storage circuit 405*a* (Step S155).

The average value calculation circuit 407*a* extracts a predetermined number of lower values of the AFE output value AFESIG(p) by referring to the AFE output value descending order sort information (step S156). The predetermined number of the lower values to be extracted from the AFE output values AFESIG(p) is set to 10, for example. In this case, the average value calculation circuit 407*a* calculates the lower average value AFESIGaveL of the AFE output values AFESIG(P) to AFESIG(P−9) from the rank P to the rank P−9 extracted in ascending order (Step S157), and stores the lower average value AFESIGaveL in the storage circuit 405*a* (Step S158).

FIG. 28 illustrates an example of extracting the AFE output values AFESIG(1) to AFESIG(10) from the rank 1 to the rank 10 in descending order as the upper values, and extracting the AFE output values AFESIG(P) to AFESIG (P−9) from the rank P to the rank P−9 in ascending order as the lower values. However, the predetermined number "10" illustrated herein by which each group of the upper and lower values of the AFE output values AFESIG(p) is extracted is an example, and the present disclosure is not limited by the predetermined number by which each group of the upper and lower values of the AFE output values AFESIG(p) is extracted.

A comparative determination circuit 403*b* reads the upper threshold AFESIGthU and the upper average value AFESIGaveU that are stored in the storage circuit 405*a* (Step S159), and determines whether the upper average value AFESIGaveU is equal to or higher than the upper threshold AFESIGthU (Step S160).

If the upper average value AFESIGaveU is lower than the upper threshold AFESIGthU (AFESIGaveU<AFESIGthU, No at Step S160), the comparative determination circuit 403*b* reads the lower threshold AFESIGthL and the lower average value AFESIGaveL that are stored in the storage circuit 405*a* (Step S161), and determines whether the lower average value AFESIGaveL is equal to or lower than the lower threshold AFESIGthL (Step S162).

If the lower average value AFESIGaveL is higher than the lower threshold AFESIGthL (AFESIGaveL>AFESIGthL, No at Step S162), the process returns to the overall operation of the detection device 1 illustrated in FIG. 16, sets the value of the calibration process execution timer T to "0" (T=0) (Step S003), and moves to the subsequent detection process (Step S004).

If the upper average value AFESIGaveU is equal to or higher than the upper threshold AFESIGthU (AFESIGaveU>AFESIGthU, Yes at Step S160) or if the lower average value AFESIGaveL is equal to or lower than the lower threshold AFESIGthL (AFESIGaveL≤AFESIGthL, Yes at Step S162), the sensor power supply control signal output circuit 404 generates the sensor power supply control signal VDDSNSCTRL to cause the power supply circuit 123 to increase the sensor power supply potential VDDSNS by ΔV (Step S191). The generated sensor power supply control signal VDDSNSCTRL is output to the power supply circuit 123, and the process starting from Step S102 is repeated.

If the upper average value AFESIGaveU is lower than the upper threshold AFESIGthU (AFESIGaveU<AFESIGthU, No at Step S160) and the lower average value AFESIGaveL is higher than the lower threshold AFESIGthL (AFESIGaveL>AFESIGthL, No at Step S162), the process returns to the overall operation of the detection device 1 illustrated in FIG. 16, sets the value of the calibration process execution timer T to "0" (T=0) (Step S003), and moves to the subsequent detection process (Step S004). The value of ΔV serving as the increment of the sensor power supply potential VDDSNS is set to 0.1 V (ΔV=0.1 V), for example. The value of the increment ΔV (=0.1 V) of the sensor power supply potential VDDSNS illustrated herein is an example, and the present disclosure is not limited by the value of the increment ΔV of the sensor power supply potential VDDSNS.

According to the third embodiment described above, the calibration process for the sensor power supply potential VDDSNS according to the third embodiment is performed at a period of the predetermined time (calibration process execution time threshold Tth) or more. Specifically, in the calibration process for the sensor power supply potential VDDSNS according to the third embodiment, the sensor power supply potential VDDSNS is increased if the upper average value AFESIGaveU is equal to or higher than the upper threshold AFESIGthU (first threshold), or if the lower average value AFESIGaveL is equal to or lower than the lower threshold AFESIGthL (second threshold). The upper average value AFESIGaveU is the average value of the predetermined number of the upper AFE output values AFESIG(p) among all the AFE output values AFESIG(n, m) corresponding to the optical sensors PD in the entire detection area AA. The lower average value AFESIGaveL is the average value of the predetermined number of the lower AFE output values AFESIG(p) among all the AFE output values AFESIG(n, m) corresponding to the optical sensors PD in the entire detection area AA.

This operation allows the sensor power supply potential VDDSNS to increase in accordance with the change over time of the AFE output values corresponding to the optical sensors PD in the entire detection area AA when the entire detection area AA is irradiated with a constant amount of light (at 1 μW, for example), in the same manner as in the first and the second embodiments. As a result, the reverse bias voltage applied to the optical sensors PD in the entire detection area AA can be increased. Thus, the spot irregularities that would be caused by the defects in the optical sensors PD can be reduced, and the detection accuracy and the imaging characteristics can be improved, in the same manner as in the first and the second embodiments.

Fourth Embodiment

Figure 30:
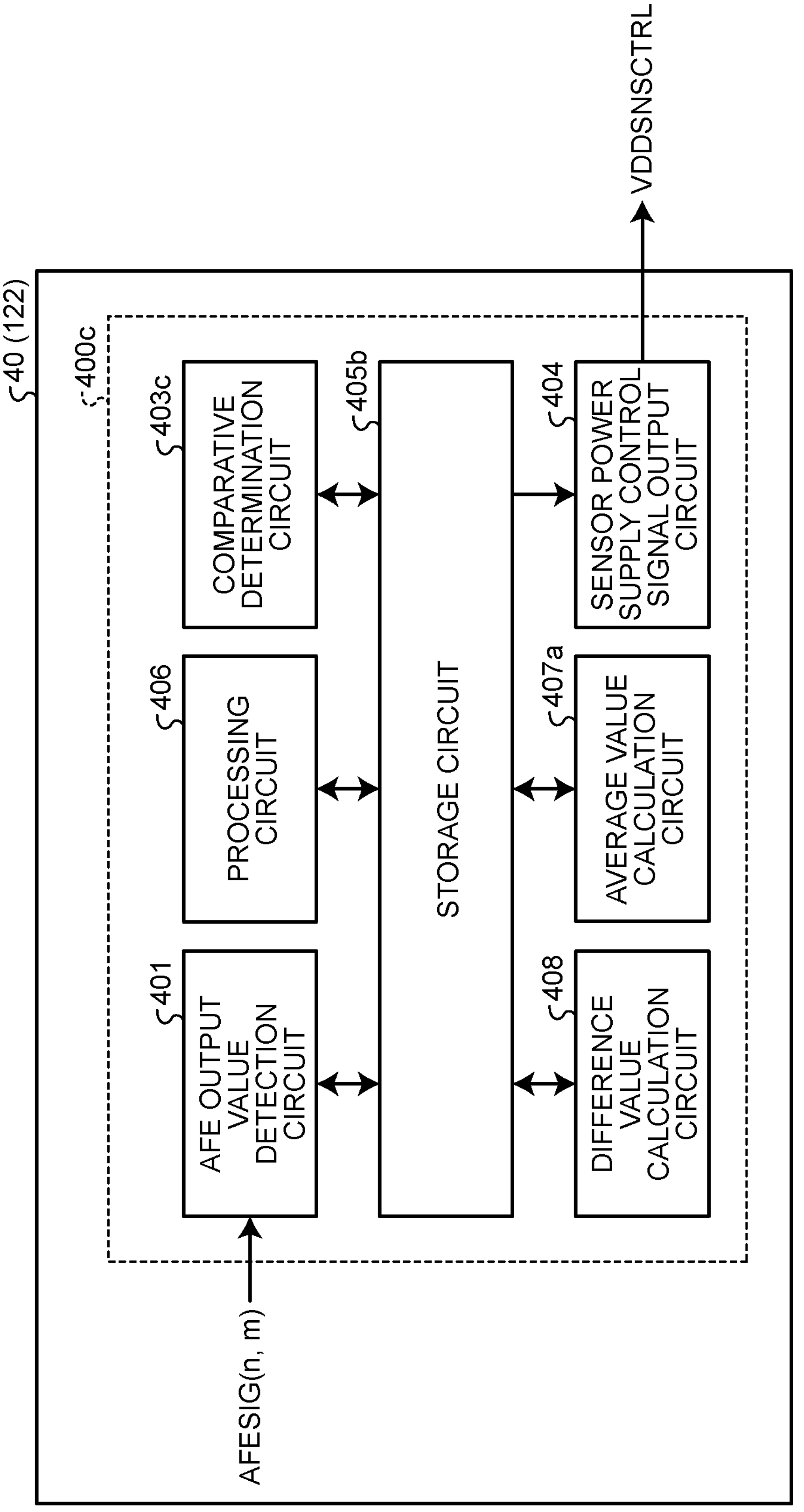
FIG. 30 is a diagram illustrating an exemplary circuit configuration of a sensor power supply control circuit of the detection device according to a fourth embodiment of the present disclosure.
Figure 31:
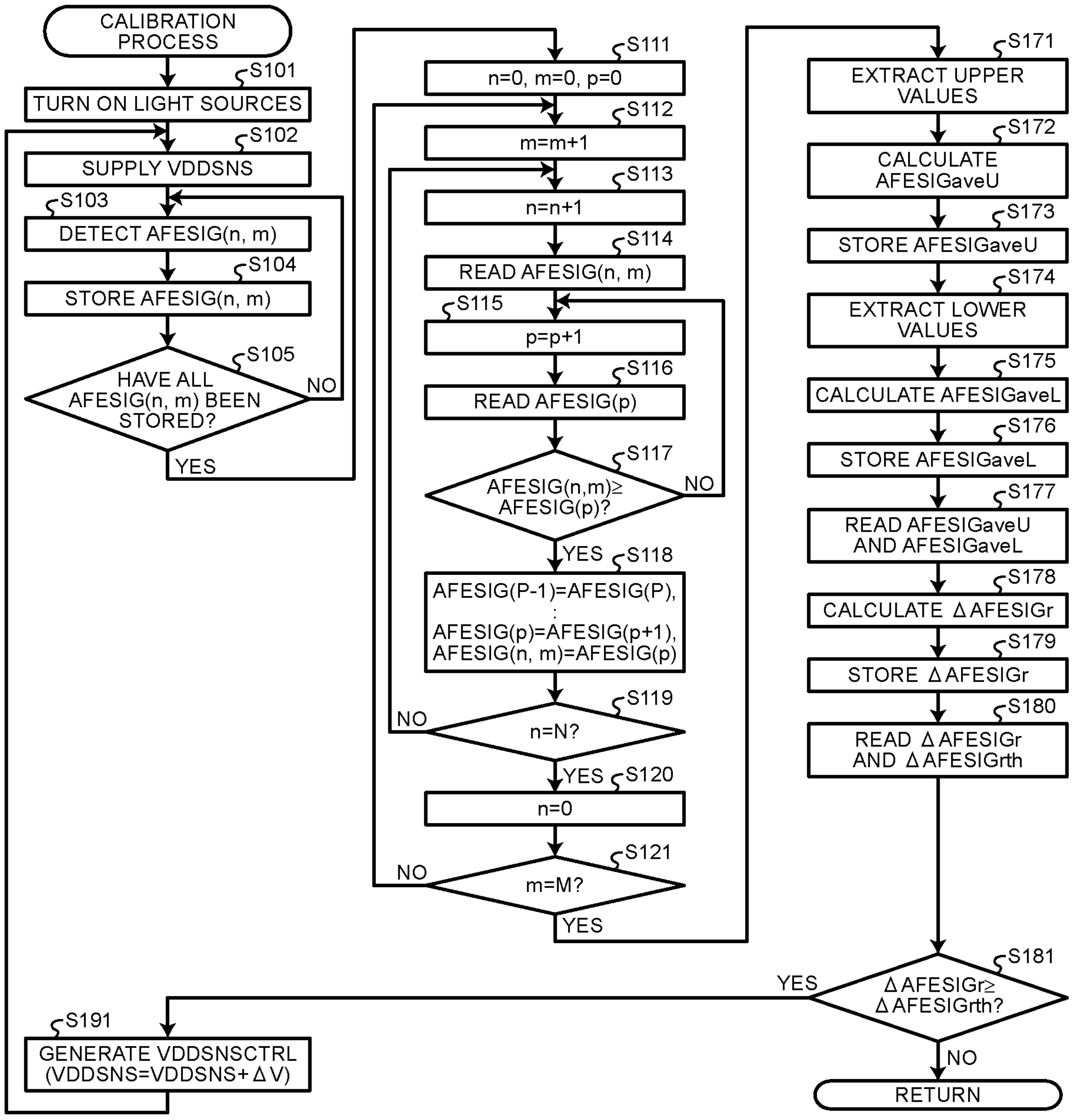
FIG. 31 is a flowchart illustrating an exemplary calibration process for the sensor power supply potential according to the fourth embodiment.

FIG. 30 is a diagram illustrating an exemplary circuit configuration of a sensor power supply control circuit of the detection device according to a fourth embodiment of the present disclosure. FIG. 31 is a flowchart illustrating an exemplary calibration process for the sensor power supply potential according to the fourth embodiment. The overall operation, the AFE output value information, the AFE output value descending order sort information, the histogram illustrating an exemplary distribution of the AFE output values, and the change over time of the sensor power supply potential in the detection device 1 according to the fourth embodiment are the same as those of the embodiments described above, and therefore, will not be described in detail. Duplicate description may also be omitted for portions of the circuit configuration of the sensor power supply control circuit of the detection device and portions of the calibration process for the sensor power supply potential VDDSNS according to the fourth embodiment that are the same as those according to any one the embodiments described above.

As illustrated in FIG. 30, a sensor power supply control circuit 400*c* according to the fourth embodiment includes a difference value calculation circuit 408 instead of the threshold generation circuit. The function of the difference value calculation circuit 408 may be integrated into, for example, the signal processing circuit 44, in the same manner as the functions of the AFE output value detection circuit 401, a comparative determination circuit 403*c*, the sensor power supply control signal output circuit 404, the processing circuit 406, and the average value calculation circuit 407*a*.

A storage circuit 405*b* of the sensor power supply control circuit 400*c* according to the fourth embodiment illustrated in FIG. 30 has stored therein in advance a difference threshold ΔAFESIGrth for a difference value ΔAFESIGr between the upper average value AFESIGaveU and the lower average value AFESIGaveL (to be describe later). The difference threshold ΔAFESIGrth is set as appropriate according to the characteristics of the device.

In the calibration process for the sensor power supply potential VDDSNS according to the fourth embodiment illustrated in FIG. 31, the descending order sort process (Steps S111 to S121) generates the same AFE output value descending order sort information as that of the embodiments described above. The average value calculation circuit 407*a* then extracts a predetermined number of upper values of the AFE output values AFESIG(p) with reference to the AFE output value descending order sort information (Step S171). The predetermined number of the upper values to be extracted from the AFE output values AFESIG(p) is set to 10, for example. In this case, the average value calculation circuit 407*a* calculates the upper average value AFESIGaveU of the AFE output values AFESIG(1) to AFESIG(10) from the rank 1 to the rank 10 extracted in descending order (Step S172), and stores the upper average value AFESIGaveU in the storage circuit 405*b* (Step S173).

The average value calculation circuit 407*a* extracts a predetermined number of lower values of the AFE output values AFESIG(p) with reference to the AFE output value descending order sort information (Step S174). The predetermined number of the lower values to be extracted from the AFE output values AFESIG(p) is set to 10, for example. In this case, the average value calculation circuit 407*a* calculates the lower average value AFESIGaveL of the AFE output values AFESIG(P) to AFESIG(P−9) from the rank P to the rank P−9 extracted in ascending order (Step S175), and stores the lower average value AFESIGaveL in the storage circuit 405*b* (Step S176).

The predetermined number "10" illustrated herein by which each group of the upper and lower values of the AFE output values AFESIG(p) is extracted is an example, and the present disclosure is not limited by the predetermined number by which each group of the upper and lower values of the AFE output values AFESIG(p) is extracted.

The difference value calculation circuit 408 reads the upper average value AFESIGaveU and the lower average value AFESIGaveL that are stored in the storage circuit 405*b* (Step S177), calculates the difference value ΔAFESIGr between the upper average value AFESIGaveU and the lower average value AFESIGaveL (Step S178), and stores the difference value ΔAFESIGr in the storage circuit 405*b* (Step S179).

The comparative determination circuit 403*c* reads the difference value ΔAFESIGr and the difference threshold ΔAFESIGrth that are stored in the storage circuit 405*b* (Step S180), and determines whether the difference value ΔAFESIGr between the upper average value AFESIGaveU and the lower average value AFESIGaveL is equal to or higher than the difference threshold ΔAFESIGrth (Step S181).

If the difference value ΔAFESIGr between the upper average value AFESIGaveU and the lower average value AFESIGaveL is lower than the difference threshold ΔAFESIGrth (ΔAFESIGr<ΔAFESIGrth, No at step S181), the process returns to the overall operation of the detection device 1 illustrated in FIG. 16, sets the value of the calibration process execution timer T to "0" (T=0) (Step S003), and moves to the subsequent detection process (Step S004).

If the difference value ΔAFESIGr between the upper average value AFESIGaveU and the lower average value AFESIGaveL is equal to or higher than the difference threshold ΔAFESIGrth (ΔAFESIGr≥ΔAFESIGrth, Yes at Step S181), the sensor power supply control signal output circuit 404 generates the sensor power supply control signal VDDSNSCTRL to cause the power supply circuit 123 to increase the sensor power supply potential VDDSNS by ΔV (Step S191). The generated sensor power supply control signal VDDSNSCTRL is output to the power supply circuit 123, and the process starting from Step S102 is repeated. The value of ΔV serving as the increment of the sensor power supply potential VDDSNS is set to 0.1 V (ΔV=0.1 V), for example. The value of the increment ΔV (=0.1 V) of the sensor power supply potential VDDSNS illustrated herein is an example, and the present disclosure is not limited by the value of the increment ΔV of the sensor power supply potential VDDSNS.

According to the fourth embodiment described above, the calibration process for the sensor power supply potential VDDSNS according to the fourth embodiment is performed each time the predetermined time (calibration process execution time threshold Tth) or more elapses. Specifically, in the calibration process for the sensor power supply potential VDDSNS according to the fourth embodiment, the sensor power supply potential VDDSNS is increased if the difference value ΔAFESIGr between the upper average value AFESIGaveU and the lower average value AFESIGaveL is equal to or higher than the difference threshold ΔAFESIGrth. The upper average value AFESIGaveU is the average value of the predetermined number of the upper AFE output values AFESIG(p) among all the AFE output values AFESIG(n, m) corresponding to the optical sensors PD in the entire detection area AA. The lower average value AFESIGaveL is the average value of the predetermined number of the lower AFE output values AFESIG(p) among all the AFE output values AFESIG(n, m) corresponding to the optical sensors PD in the entire detection area AA.

This operation allows the sensor power supply potential VDDSNS to increase in accordance with the change over time of the AFE output values corresponding to the optical sensors PD in the entire detection area AA when the entire detection area AA is irradiated with a constant amount of light (at 1 μW, for example), in the same manner as in the embodiments described above. As a result, the reverse bias voltage applied to the optical sensors PD in the entire detection area AA can be increased. Thus, the spot irregularities that would be caused by the defects in the optical sensors PD can be reduced, and the detection accuracy and the imaging characteristics can be improved, in the same manner as in the embodiments described above.

In the embodiments described above, an aspect has been exemplified in which the calibration process for the sensor power supply potential is performed if the value of the calibration process execution timer T is equal to or higher than the predetermined calibration process execution time threshold Tth. However, an aspect may be employed in which the sensor power supply potential VDDSNS is increased when a predetermined time has elapsed, or each time a predetermined time has elapsed.

While the preferred embodiments of the present disclosure have been described above, the present disclosure is not limited to the embodiments described above. The content disclosed in the embodiments is merely an example, and can be variously modified within the scope not departing from the gist of the present disclosure. Any modifications appropriately made within the scope not departing from the gist of the present disclosure also naturally belong to the technical scope of the present disclosure. At least one of various omissions, substitutions, and changes of the components can be made without departing from the gist of the embodiments and the modifications described above.

What is claimed is:

1. A detection device comprising:

a plurality of organic photodiodes arranged in a detection area;

a plurality of capacitive elements each coupled in parallel to a corresponding organic photodiode of the organic photodiodes;

an analog front-end (AFE) circuit configured to read an electric charge amount stored in each of the capacitive elements to acquire a detection value of each of the organic photodiodes;

a power supply circuit configured to supply a power supply potential to collectively apply a reverse bias to the organic photodiodes; and a control circuit configured to control the power supply potential, wherein the organic photodiodes each comprise:

an active layer;

an upper electrode provided with an upper buffer layer interposed between the upper electrode and the active layer; and a lower electrode provided with a lower buffer layer interposed between the lower electrode and the active layer, and the control circuit is configured to increase the power supply potential when, among the output values, the number of output values that are equal to or higher than a predetermined threshold is equal to or larger than a predetermined number.

2. The detection device according to claim 1, wherein in the power supply potential, a second sensor power supply potential at a second time after a first time is higher than a first sensor power supply potential at the first time.

3. The detection device according to claim 2, wherein the control circuit is configured to determine, based on a plurality of output values output from the AFE circuit for the respective organic photodiodes, whether to increase the power supply potential.

4. A detection device comprising:

a plurality of organic photodiodes arranged in a detection area;

a plurality of capacitive elements each coupled in parallel to a corresponding organic photodiode of the organic photodiodes;

an analog front-end (AFE) circuit configured to read an electric charge amount stored in each of the capacitive elements to acquire a detection value of each of the organic photodiodes;

a power supply circuit configured to supply a power supply potential to collectively apply a reverse bias to the organic photodiodes; and a control circuit configured to control the power supply potential, wherein the organic photodiodes each comprise:

an active layer;

an upper electrode provided with an upper buffer layer interposed between the upper electrode and the active layer; and a lower electrode provided with a lower buffer layer interposed between the lower electrode and the active layer, and the control circuit is configured to increase the power supply potential when an average value of a predetermined number of upper values of the output values and a predetermined number of lower values of the output values is equal to or higher than a predetermined threshold.

5. A detection device comprising:

a plurality of organic photodiodes arranged in a detection area;

a plurality of capacitive elements each coupled in parallel to a corresponding organic photodiode of the organic photodiodes;

an analog front-end (AFE) circuit configured to read an electric charge amount stored in each of the capacitive elements to acquire a detection value of each of the organic photodiodes;

a power supply circuit configured to supply a power supply potential to collectively apply a reverse bias to the organic photodiodes; and a control circuit configured to control the power supply potential, wherein the organic photodiodes each comprise:

an active layer;

an upper electrode provided with an upper buffer layer interposed between the upper electrode and the active layer; and a lower electrode provided with a lower buffer layer interposed between the lower electrode and the active layer, and the control circuit is configured to increase the power supply potential when an average value of a predetermined number of upper values of the output values is equal to or higher than a predetermined first threshold, or an average value of a predetermined number of lower values of the output values is equal to or lower than a predetermined second threshold lower than the first threshold.

6. A detection device comprising:

a plurality of organic photodiodes arranged in a detection area;

a plurality of capacitive elements each coupled in parallel to a corresponding organic photodiode of the organic photodiodes;

an analog front-end (AFE) circuit configured to read an electric charge amount stored in each of the capacitive elements to acquire a detection value of each of the organic photodiodes;

a power supply circuit configured to supply a power supply potential to collectively apply a reverse bias to the organic photodiodes; and a control circuit configured to control the power supply potential, wherein the organic photodiodes each comprise:

an active layer;

an upper electrode provided with an upper buffer layer interposed between the upper electrode and the active layer; and a lower electrode provided with a lower buffer layer interposed between the lower electrode and the active layer, and the control circuit is configured to increase the power supply potential when a difference value between an average value of a predetermined number of upper values of the output values and an average value of a predetermined number of lower values of the output values is equal to or higher than a predetermined difference threshold.

7. The detection device according to claim 1, further comprising a light source configured to emit light to the detection area, wherein the light source is configured to emit a substantially constant amount of light to the detection area when the control circuit determines whether to increase the power supply potential.

8. The detection device according to claim 7, wherein the control circuit is configured to determine, each time a predetermined time has elapsed, whether to increase the power supply potential.

9. The detection device according to claim 8, wherein the control circuit is configured to determine, at start-up, whether to increase the power supply potential.

10. The detection device according to claim 4, wherein in the power supply potential, a second sensor power supply potential at a second time after a first time is higher than a first sensor power supply potential at the first time.

11. The detection device according to claim 10, wherein the control circuit is configured to determine, based on a plurality of output values output from the AFE circuit for the respective organic photodiodes, whether to increase the power supply potential.

12. The detection device according to claim 4, further comprising a light source configured to emit light to the detection area, wherein the light source is configured to emit a substantially constant amount of light to the detection area when the control circuit determines whether to increase the power supply potential.

13. The detection device according to claim 5, wherein in the power supply potential, a second sensor power supply potential at a second time after a first time is higher than a first sensor power supply potential at the first time.

14. The detection device according to claim 13, wherein the control circuit is configured to determine, based on a plurality of output values output from the AFE circuit for the respective organic photodiodes, whether to increase the power supply potential.

15. The detection device according to claim 5, further comprising a light source configured to emit light to the detection area, wherein the light source is configured to emit a substantially constant amount of light to the detection area when the control circuit determines whether to increase the power supply potential.

16. The detection device according to claim 6, wherein in the power supply potential, a second sensor power supply potential at a second time after a first time is higher than a first sensor power supply potential at the first time.

17. The detection device according to claim 16, wherein the control circuit is configured to determine, based on a plurality of output values output from the AFE circuit for the respective organic photodiodes, whether to increase the power supply potential.

18. The detection device according to claim 6, further comprising a light source configured to emit light to the detection area, wherein the light source is configured to emit a substantially constant amount of light to the detection area when the control circuit determines whether to increase the power supply potential.

* * * * *